US012777598B2

(12) United States Patent
Kim

(10) Patent No.: US 12,777,598 B2
(45) Date of Patent: Oct. 27, 2026

(54) DISPLAY DEVICE

(71) Applicant: Samsung Display Co., Ltd., Yongin-si (KR)

(72) Inventor: Joon-Hyung Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 163 days.

(21) Appl. No.: 18/922,939

(22) Filed: Oct. 22, 2024

(65) Prior Publication Data

US 2025/0227864 A1 Jul. 10, 2025

(30) Foreign Application Priority Data

Jan. 5, 2024 (KR) ........................ 10-2024-0002454

(51) Int. Cl.
*H05K 5/02* (2006.01)
*H04M 1/02* (2006.01)
*H05K 5/03* (2006.01)

(52) U.S. Cl.
CPC ........ *H05K 5/0217* (2013.01); *H04M 1/0216* (2013.01); *H04M 1/0268* (2013.01); *H05K 5/03* (2013.01)

(58) Field of Classification Search
CPC ..... H05K 5/0217; H05K 5/03; H04M 1/0216; H04M 1/0268; H10K 59/872; H10K 77/111; H10K 2102/351; G06F 1/1641; G06F 1/1652; G09F 9/301
See application file for complete search history.

(56) References Cited

U.S. PATENT DOCUMENTS

| | | | |
|---|---|---|---|
| 10,657,850 | B2 | 5/2020 | Kim |
| 11,672,084 | B2 | 6/2023 | Ha et al. |
| 11,775,008 | B2 | 10/2023 | Ha et al. |

(Continued)

FOREIGN PATENT DOCUMENTS

| | | | |
|---|---|---|---|
| JP | 2013238029 | A | 11/2013 |
| KR | 1020160035262 | A | 3/2016 |

(Continued)

OTHER PUBLICATIONS

Xizhou Wang et al., "Dynamic response of Voronoi structures with gradient perpendicular to the impact direction," Reviews on Advanced Materials Science, vol. 61, No. 1, 2022, pp. 513-525.

*Primary Examiner* — Kevin Quarterman
(74) *Attorney, Agent, or Firm* — CANTOR COLBURN LLP

(57) ABSTRACT

A display device includes: a display panel including pixels, a folding area foldable about a folding axis extending in a first direction, and a first non-folding area and a second non-folding area spaced apart from each other in a second direction with the folding area therebetween; and a glass cover disposed on the display panel and including a first non-folding part, a folding part, and a second non-folding part arranged in the second direction and overlapping the first non-folding area, the folding area, and the second non-folding area, respectively. The folding part defines grooves corresponding to closed lines, respectively. Each of the closed lines corresponds to a pattern obtained by modifying an aspect ratio of a Voronoi pattern to 1:n. The aspect ratio is a ratio of a length in the second direction to a length in the first direction of the Voronoi pattern. "n" is greater than 1.

20 Claims, 26 Drawing Sheets

(56) References Cited

U.S. PATENT DOCUMENTS

| | | | | |
|---|---|---|---|---|
| 2022/0216436 | A1 | 7/2022 | Kim et al. | |
| 2023/0018777 | A1* | 1/2023 | Park | G06F 1/1656 |
| 2023/0029926 | A1* | 2/2023 | Park | G06F 1/1626 |
| 2023/0042280 | A1 | 2/2023 | Kim et al. | |
| 2023/0096041 | A1 | 3/2023 | Oh et al. | |
| 2023/0195174 | A1* | 6/2023 | Kim | G06F 1/1652<br>361/679.01 |
| 2023/0259173 | A1* | 8/2023 | Choung | G06F 1/1637<br>361/679.01 |
| 2023/0393622 | A1* | 12/2023 | Wang | G06F 1/1652 |
| 2024/0292709 | A1* | 8/2024 | Yang | H10K 77/111 |

FOREIGN PATENT DOCUMENTS

| | | | |
|---|---|---|---|
| KR | 102176216 | B1 | 11/2020 |
| KR | 1020210101356 | A | 8/2021 |
| KR | 1020210103027 | A | 8/2021 |
| KR | 1020210130474 | A | 11/2021 |
| KR | 1020220043500 | A | 4/2022 |
| KR | 1020220099165 | A | 7/2022 |
| KR | 1020230038361 | A | 3/2023 |
| KR | 1020230049030 | A | 4/2023 |
| KR | 1020230049573 | A | 4/2023 |
| KR | 102530471 | B1 | 5/2023 |
| KR | 102609511 | B1 | 12/2023 |

* cited by examiner

DISPLAY DEVICE

This application claims priority to Korean Patent Application No. 10-2024-0002454, filed on Jan. 5, 2024, and all the benefits accruing therefrom under 35 U.S.C. § 119, the content of which in its entirety is herein incorporated by reference.

BACKGROUND

Embodiments of the present disclosure described herein relate to a display device, and more particularly, relate to a display device including a foldable glass cover.

Various types of display devices are being used to provide image information, and display devices including a flexible display panel that is able to be folded or bent are being developed. Unlike a rigid display device, a flexible display device may be diversely changed in shape by folding, rolling, or bending and thus may be carried regardless of the size of a displayed screen.

The flexible display device requires a glass cover for protecting a display panel without impeding a folding or bending operation. Accordingly, a glass cover that has excellent folding characteristics without deteriorating mechanical properties and provides improved display quality is desirable.

SUMMARY

Embodiments of the present disclosure provide a glass cover that has good folding characteristics and prevents deterioration in display quality.

According to an embodiment, a display device includes: a display panel and a glass cover. The display panel includes a plurality of pixels, a folding area foldable about a folding axis defined in a direction parallel to a first direction, and a first non-folding area and a second non-folding area spaced apart from each other in a second direction crossing the first direction with the folding area therebetween, and the glass cover is disposed on the display panel and includes a first non-folding part, a folding part, and a second non-folding part that are arranged in the second direction and that overlap the first non-folding area, the folding area, and the second non-folding area, respectively. The folding part defines grooves corresponding to closed lines, respectively. Pixels that overlap the folding area form a regular pattern, and the closed lines form an irregular pattern. A first reference ratio defined as the number of grooves per unit length that overlap a line that extends in the first direction and passes through a center point of the folding part is smaller than a second reference ratio defined as the number of grooves per unit length that overlap a line that extends in the second direction and passes through the center point of the folding part.

The irregular pattern may correspond to a pattern obtained by modifying an aspect ratio of a Voronoi pattern to 1:n. The aspect ratio may be a ratio of a length in the second direction to a length in the first direction of the Voronoi pattern, and n may be greater than 1.

n may be less than or equal to 5.

The folding part may include a first portion adjacent to the folding axis and a second portion farther away from the folding axis than the first portion, and a density of the closed lines in the first portion may be lower than a density of the closed lines in the second portion.

The folding area may include a plurality of folding areas, and the plurality of folding areas may be foldable about different folding axes. The folding part may include a plurality of folding parts, and the number of folding areas may be equal to the number of folding parts.

A ratio of the second reference ratio to the first reference ratio may be greater than 1 and less than or equal to 5.

The glass cover may further include a filling portion accommodated in the grooves, and the filling portion may include at least one of an acrylate-based resin, a silicone-based resin, a urethane-based resin, or an epoxy-based resin.

The filling portion may have a thickness greater than a depth of each of the grooves.

The glass cover may have a thickness of 50 micrometers (μm) to 150 μm, and the folding part may have a width of 6.6 millimeters (mm) or less in the second direction.

The plurality of grooves may each have a width of 50 μm to 100 μm, and the plurality of grooves may each have a depth of 50 μm to 100 μm.

Upper and lower sides of each of the grooves may have different widths.

The grooves may be connected together to have a one-body shape, and the irregular pattern may have a net shape.

The glass cover may include an upper surface that faces the display panel and a lower surface that faces away from the upper surface, and the plurality of grooves may be defined on the upper surface of the glass cover or the lower surface of the glass cover.

The plurality of grooves may include a plurality of first grooves defined on the upper surface of the glass cover and a plurality of second grooves defined on the lower surface of the glass cover, and the first grooves and the second grooves may not overlap each other in a plan view.

According to an embodiment, a display device includes a display panel and a glass cover. The display panel includes a plurality of pixels, a folding area foldable about a folding axis defined in a direction parallel to a first direction, and a first non-folding area and a second non-folding area spaced apart from each other in a second direction crossing the first direction with the folding area therebetween, and The glass cover is disposed on the display panel and includes a first non-folding part, a folding part, and a second non-folding part that are arranged in the second direction and that overlap the first non-folding area, the folding area, and the second non-folding area, respectively. The folding part defines grooves corresponding to closed lines, respectively. Each of the closed lines corresponds to a pattern obtained by modifying an aspect ratio of a Voronoi pattern to 1:n. The aspect ratio is a ratio of a length in the second direction to a length in the first direction of the Voronoi pattern, and n is greater than 1.

A first reference ratio defined as the number of grooves per unit length that overlap a line that extends in the first direction with respect to a center point of the folding part may be smaller than a second reference ratio defined as the number of grooves per unit length that overlap a line that extends in the second direction with respect to the center point of the folding part.

n may be less than or equal to 5.

The folding part may include a first portion adjacent to the folding axis and a second portion farther away from the folding axis than the first portion, and a density of the closed lines in the first portion may be lower than a density of the closed lines in the second portion.

The glass cover may further include a filling portion accommodated in the grooves.

The grooves may be connected together to have a one-body shape. The closed lines may form an irregular pattern, and the irregular pattern may have a net shape.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1A:
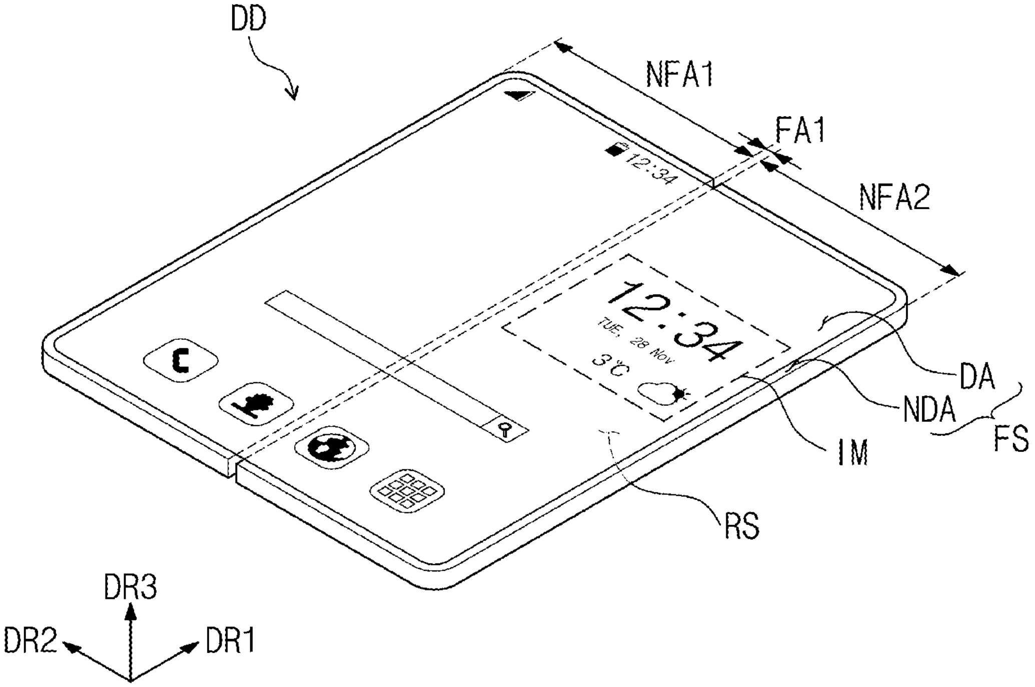
FIG. 1A is an assembled perspective view illustrating an unfolded state of a display device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, a display panel and a method of manufacturing the display panel according to an embodiment of the present disclosure will be described with reference to the accompanying drawings.

Figure 1B:
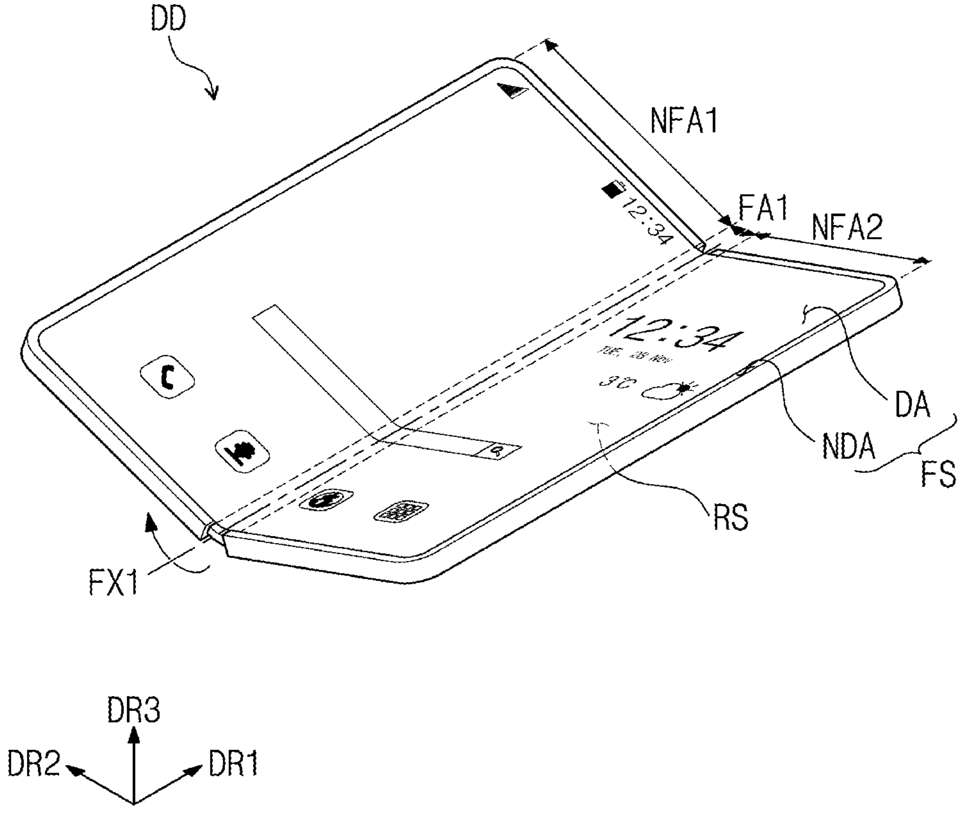
FIG. 1B is an assembled perspective view illustrating an in-folded state of the display device according to an embodiment of the present disclosure.
Figure 1C:
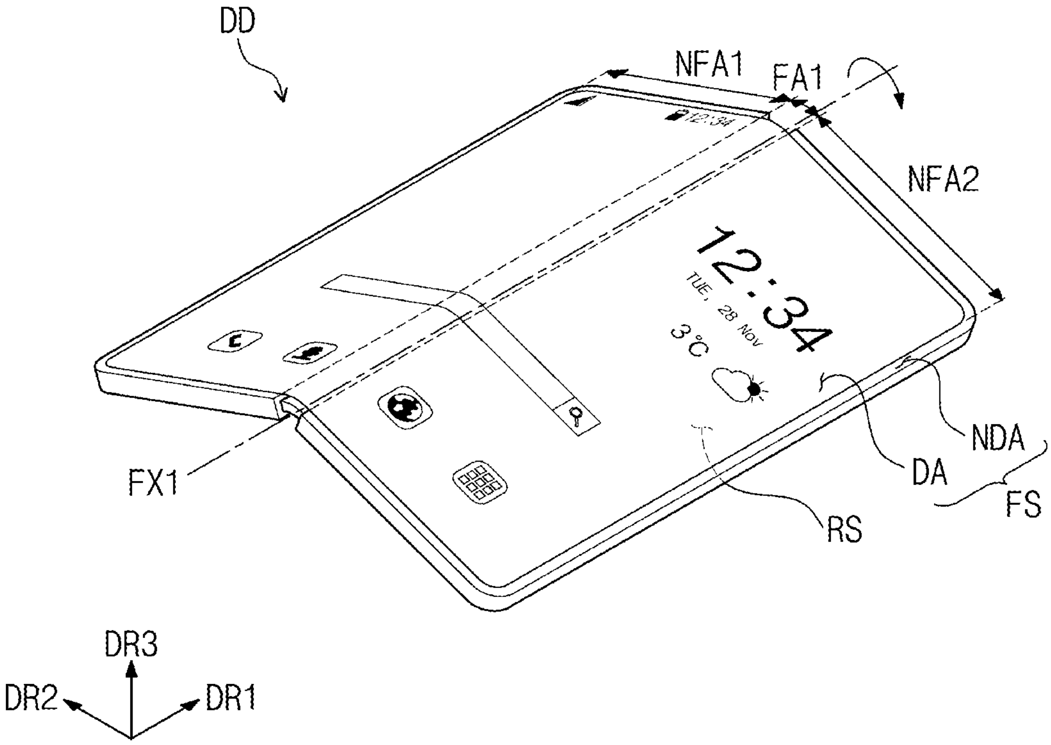
FIG. 1C is an assembled perspective view illustrating an out-folded state of the display device according to an embodiment of the present disclosure.

FIG. 1A is an assembled perspective view illustrating an unfolded state of a display device according to an embodiment of the present disclosure. FIG. 1B is an assembled perspective view illustrating an in-folded state of the display device according to an embodiment of the present disclosure. FIG. 1C is an assembled perspective view illustrating an out-folded state of the display device according to an embodiment of the present disclosure.

The display device DD of one embodiment may be a device activated depending on an electrical signal. For example, the display device DD may be a mobile phone, a tablet computer, a car navigation unit, a game machine, or a wearable device. However, embodiments are not limited thereto. FIGS. 1A to 1C illustrate an example that the display device DD is a mobile phone.

Although a first direction DR1, a second direction DR2, and a third direction DR3 are illustrated in FIG. 1A and the following drawings, the directions indicated by the first to third directions DR1, DR2, and DR3 described in this specification may be relative concepts and may be changed to other directions.

Referring to FIGS. 1A to 1C, the display device DD according to an embodiment may include a first display surface FS defined by the first direction DR1 and the second direction DR2 crossing the first direction DR1. The display device DD may provide an image IM to a user through the first display surface FS. The display device DD of one embodiment may display the image IM in the third direction DR3 through the first display surface FS parallel to the first direction DR1 and the second direction DR2. In this specification, front surfaces (or, upper surfaces) and rear surfaces (or, lower surfaces) of components are defined based on the direction in which the image IM is displayed. The front surfaces and the rear surfaces may be opposite each other in the third direction DR3, and the normal directions of the front surfaces and the rear surfaces may be parallel to the third direction DR3.

The display device DD according to an embodiment may include the first display surface FS and a second display surface RS. The first display surface FS may include a display area DA and a non-display area NDA. An electronic module area (not illustrated) may be included in the display area DA. The second display surface RS may be defined as a surface facing away from at least a portion of the first display surface FS. That is, the second display surface RS may be defined as a portion of the rear surface of the display device DD.

The display device DD according to an embodiment may sense an external input applied from the outside. The external input may include various types of inputs provided from outside the display device DD. For example, the external input may include not only a touch of a part of the user's body (e.g., a finger of the user) on the display device DD but also an external input (e.g., hovering) that is applied in proximity to the display device DD or applied adjacent to the display device DD at a certain distance. In addition, the external input may have various types such as force, pressure, temperature, light, and the like.

The display device DD may include a folding area FA1 and non-folding areas NFA1 and NFA2. The display device DD of one embodiment may include the first non-folding area NFA1 and the second non-folding area NFA2 disposed with the folding area FA1 therebetween. Although FIGS. 1A to 1C illustrate an example that the display device DD includes one folding area FA1, embodiments are not limited thereto, and the display device DD may include a plurality of folding areas defined therein.

Referring to FIG. 1B, the display device DD according to an embodiment may be folded about a first folding axis FX1. The first folding axis FX1 may be a virtual axis extending in the first direction DR1. The first folding axis FX1 may be parallel to the direction of the long sides of the display device DD. The first folding axis FX1 may extend in the first direction DR1 above the first display surface FS.

In an embodiment, the non-folding areas NFA1 and NFA2 may be disposed adjacent to the folding area FA1 with the folding area FA1 therebetween. For example, the first non-folding area NFA1 may be disposed on one side of the folding area FA1 in the second direction DR2, and the second non-folding area NFA2 may be disposed on an opposite side of the folding area FA1 in the second direction DR2.

The display device DD may be folded about the first folding axis FX1 and may be changed to the in-folded state in which one area of the first display surface FS that overlaps the first non-folding area NFA1 and an opposite area of the first display surface FS that overlaps the second non-folding area NFA2 face each other. Meanwhile, in the in-folded state of the display device DD, the second display surface RS may be visible to the user. The second display surface RS may further include an electronic module area in which an electronic module including various components is disposed, and the present disclosure is not limited to any one embodiment.

Referring to FIG. 1C, the display device DD according to an embodiment may be folded about the first folding axis FX1 and may be changed to the out-folded state in which one area of the second display surface RS that overlaps the first non-folding area NFA1 and an opposite area of the second display surface RS that overlaps the second non-folding area NFA2 face each other. However, embodiments are not limited thereto. The display device DD may be folded about a plurality of folding axes such that a portion of the first display surface FS and a portion of the second display surface RS face each other, and the number of folding axes and the number of non-folding areas are not particularly limited.

The display device DD may further include various electronic modules. For example, the electronic modules may include at least one of a camera, a speaker, a light detection sensor, or a heat detection sensor. The electronic modules may sense an external object received through the first or second display surface FS or RS, or may provide a sound signal, such as voice, to the outside through the first or second display surface FS or RS. The electronic modules may include a plurality of components and are not limited to any one embodiment.

Figure 2A:
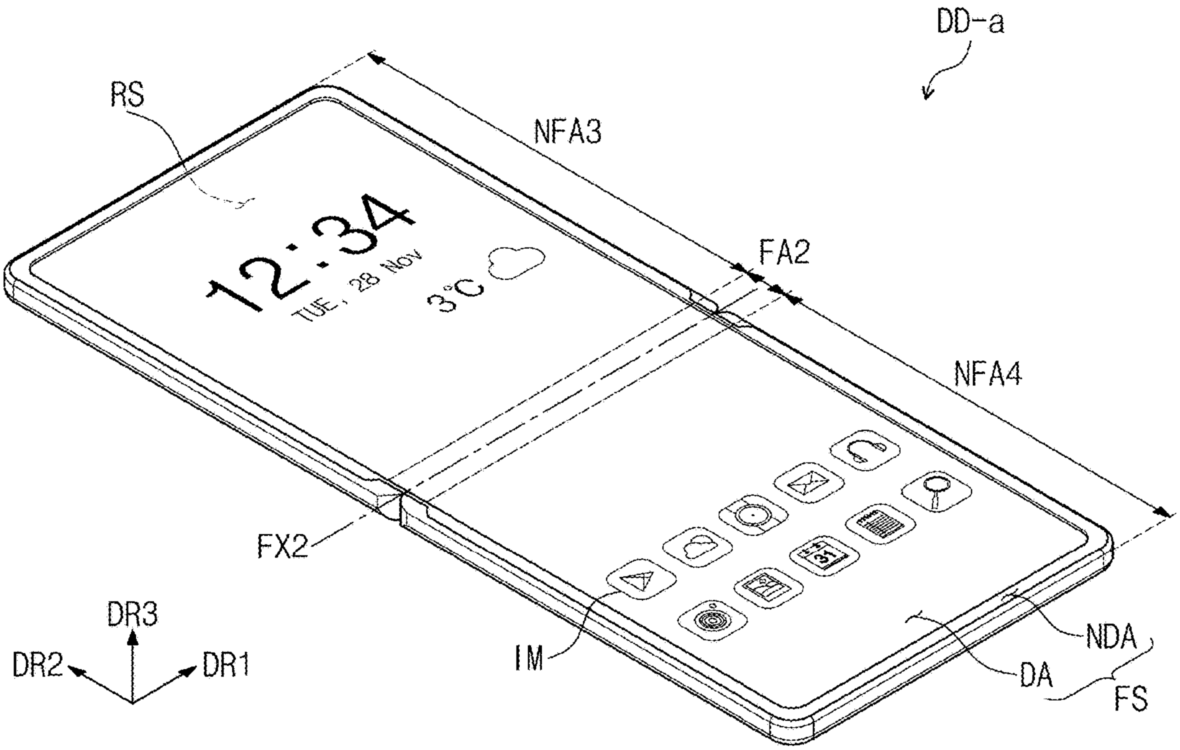
FIG. 2A is an assembled perspective view illustrating an unfolded state of a display device according to an embodiment of the present disclosure.
Figure 2B:
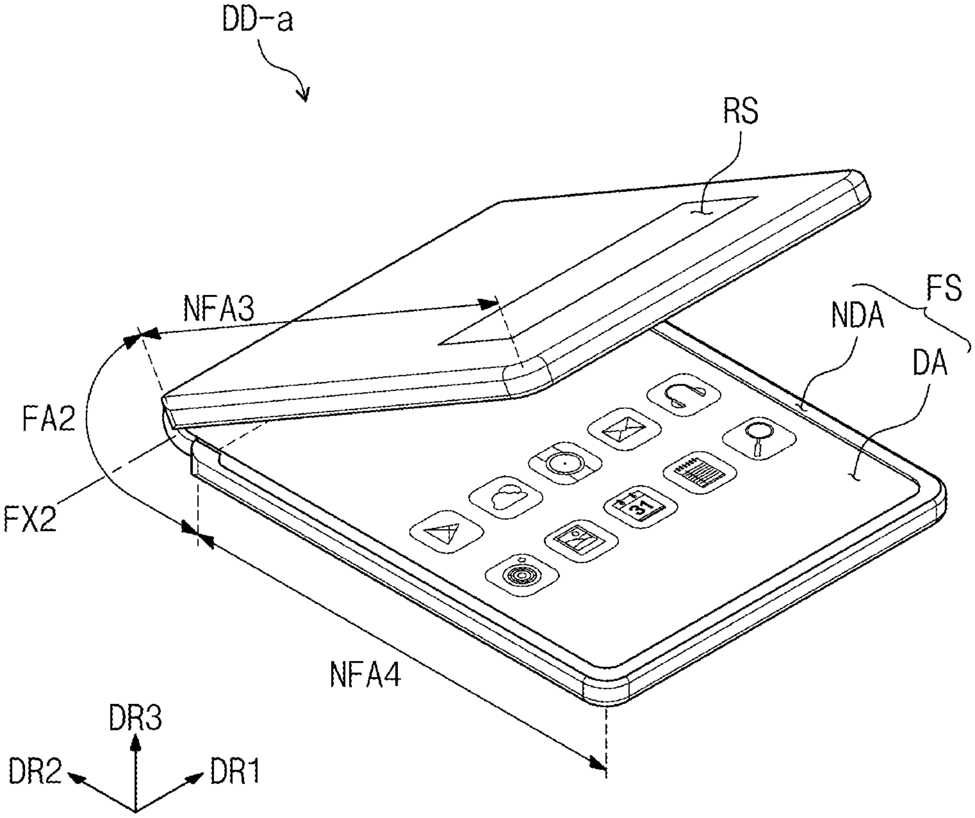
FIG. 2B is an assembled perspective view illustrating an in-folded state of the display device according to an embodiment of the present disclosure.

FIG. 2A is an assembled perspective view illustrating an unfolded state of a display device according to an embodiment of the present disclosure, and FIG. 2B is an assembled perspective view illustrating an in-folded state of the display device according to an embodiment of the present disclosure.

The display device DD-a of one embodiment may be folded about a second folding axis FX2 extending in one direction parallel to the first direction DR1. FIG. 2B illustrates an example that the extension direction of the second folding axis FX2 is parallel to the extension direction of the short sides of the display device DD-a. However, embodiments are not limited thereto.

The display device DD-a according to an embodiment may include at least one folding area FA2 and non-folding areas NFA3 and NFA4 adjacent to the folding area FA2. The non-folding areas NFA3 and NFA4 may be spaced apart from each other with the folding area FA2 therebetween.

In an embodiment, the display device DD-a may be folded in an in-folding manner such that the third non-folding area NFA3 and the fourth non-folding area NFA4 face each other and a display surface FS is not exposed to the outside. In addition, unlike that illustrated in FIG. 2B, in an embodiment, the display device DD-a may be folded in an out-folding manner such that the display surface FS is exposed to the outside. The display device DD-a of one embodiment may include the first display surface FS and a second display surface RS. The first display surface FS may include a display area DA and a non-display area NDA. In addition, the display device DD-a may further include various electronic modules.

The display devices DD and DD-a described with reference to FIGS. 1A to 1C, 2A, and 2B may be configured such that an in-folding operation and an out-folding operation are repeated in the unfolded state. However, embodiments are not limited thereto. In an embodiment, the display devices DD and DD-a may be configured to select one of an unfolding operation, an in-folding operation, and an out-folding operation. In addition, although not illustrated, a display device of one embodiment may include a plurality of folding areas, or may be a flexible display device, at least a partial area of which is able to be bent or rolled.

Figure 3:
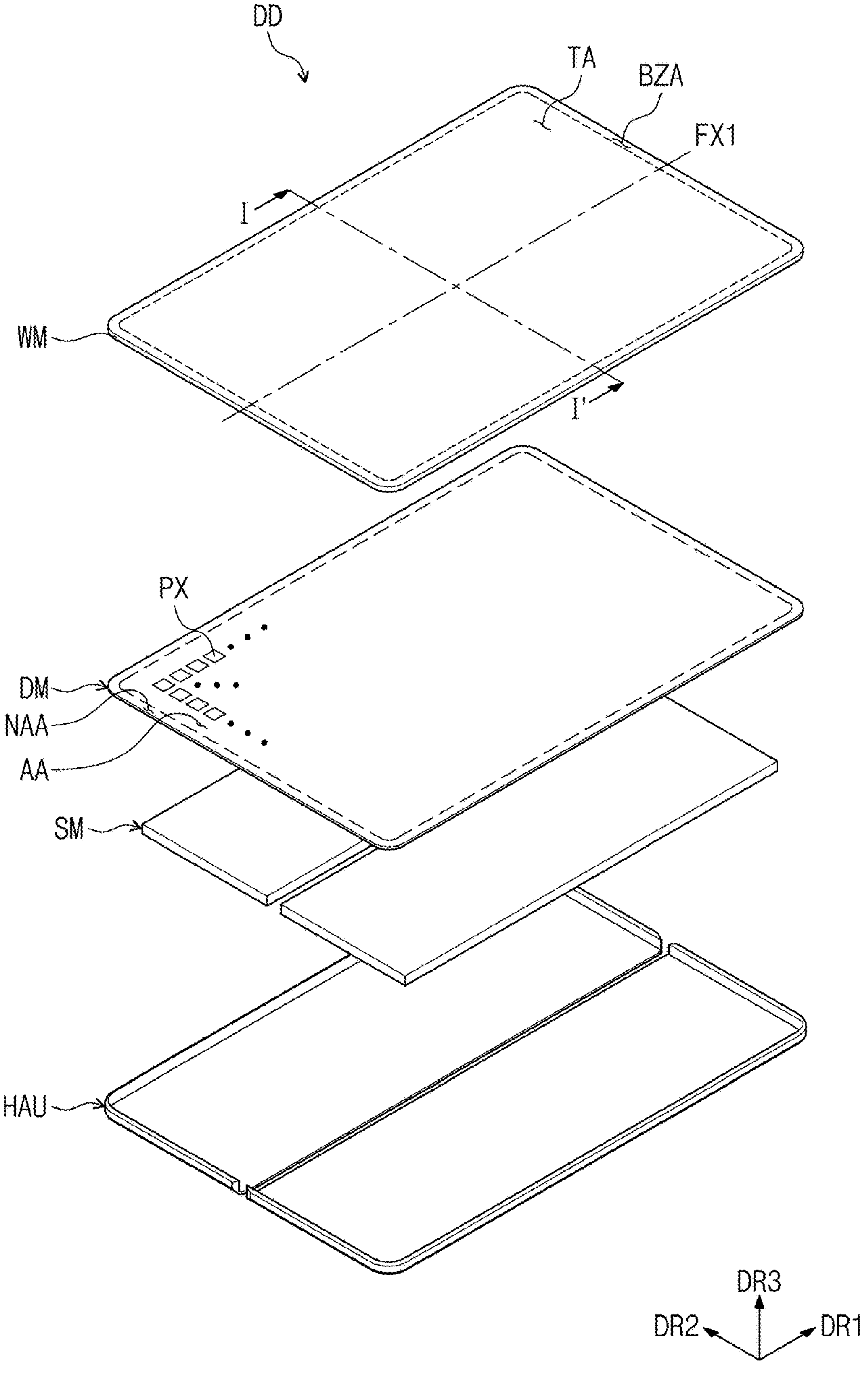
FIG. 3 is an exploded perspective view of a display device according to an embodiment of the present disclosure.
Figure 4A:
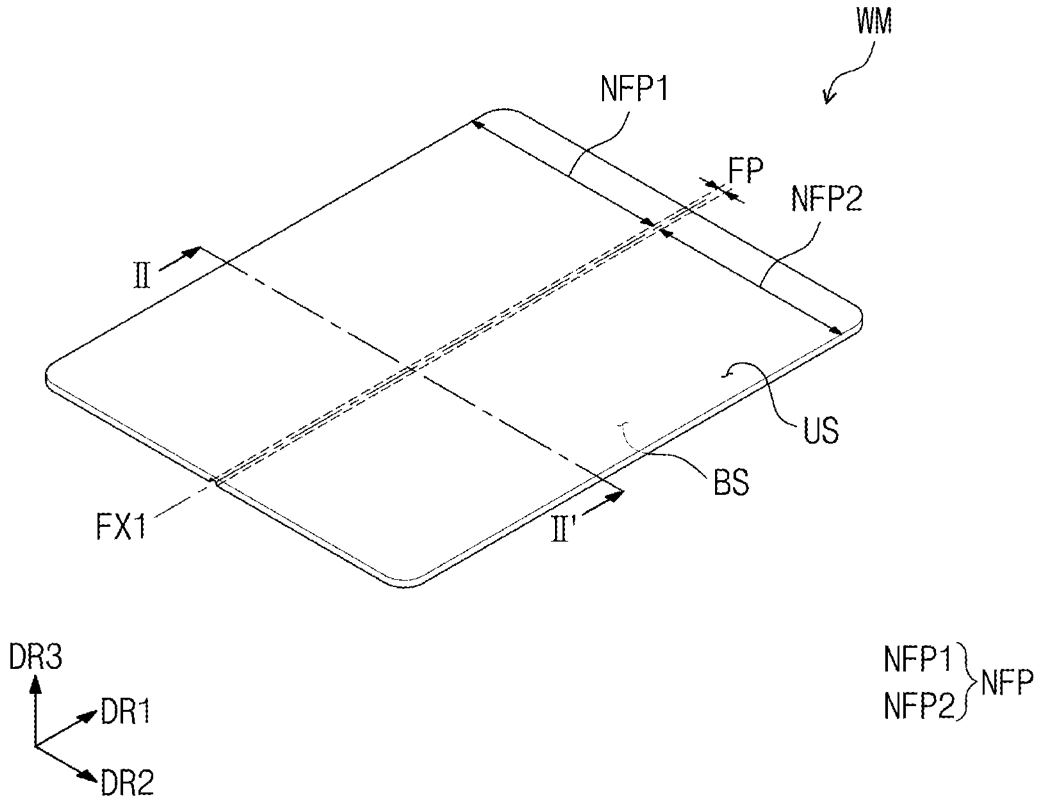
FIG. 4A is a perspective view of a window according to an embodiment of the present disclosure.
Figure 4B:
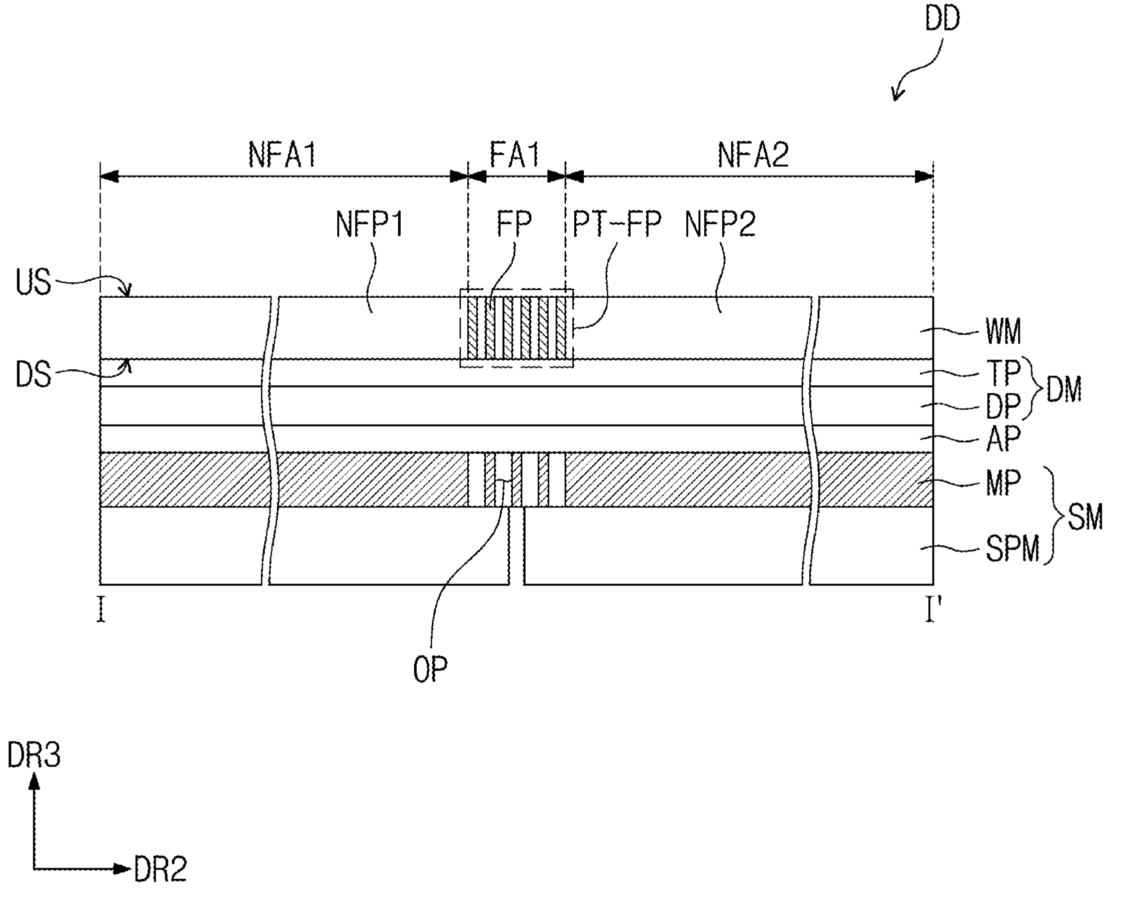
FIG. 4B is a sectional view of the display device according to an embodiment of the present disclosure.

FIG. 3 is an exploded perspective view of a display device according to an embodiment of the present disclosure. FIG. 4A is a perspective view of a window according to an embodiment of the present disclosure. FIG. 4B is a sectional view of the display device according to an embodiment of the present disclosure.

FIG. 3 illustrates an exploded perspective view of the display device DD according to one embodiment illustrated in FIG. 1A. Referring to FIG. 3, the display device DD of one embodiment may include a display module DM and the window WM disposed on the display module DM. The window WM may be disposed on and/or under the display module DM. FIG. 3 illustrates an example that the window WM is disposed on the display module DM.

The display device DD of one embodiment may further include an electronic module (not illustrated) disposed under the display module DM. For example, the electronic module (not illustrated) may include a camera module.

Although not illustrated, the display device DD of one embodiment may further include an adhesive layer and/or a polarizer film disposed between the display module DM and the window WM. In addition, although not illustrated, the display device DD of one embodiment may further include a lower functional layer disposed under the display module DM.

Referring to FIG. 3, the display device DD of one embodiment may further include a housing HAU that accommodates the display module DM, the lower functional layer, and a lower module SM. The housing HAU may be coupled with the window WM to form the exterior of the display device DD. The housing HAU may include a material having a relatively high rigidity. For example, the housing HAU may include a plurality of frames and/or plates formed of glass, plastic, or metal. The display module DM may be accommodated in a receiving space and may be protected from external impact. Although not illustrated, the housing HAU may further include a hinge structure for facilitating folding or bending.

The display module DM of one embodiment may display the image IM depending on an electrical signal and may transmit/receive information about an external input. The display module DM may include a display panel and a sensor layer disposed on the display panel.

The display module DM may include an active area AA and a peripheral area NAA. The active area AA may be an area that provides the image IM (refer to FIG. 1A). Pixels PX may be disposed in the active area AA. The peripheral area NAA may be adjacent to the active area AA. The peripheral area NAA may surround the active area AA. A drive circuit or drive wiring for driving the active area AA may be disposed in the peripheral area NAA.

The display module DM may include the plurality of pixels PX. Each of the pixels PX may emit light in response to an electrical signal. Light emitted from the pixels PX may implement the image IM. Each of the pixels PX may include a display element. For example, the display element may be an organic light emitting element, an inorganic light emitting element, an organic-inorganic light emitting element, a micro-LED, a nano-LED, a quantum-dot light emitting element, an electrophoretic element, or an electrowetting element.

In an embodiment, the display module DM includes at least the display panel DP. The display panel DP may be an emissive display panel and is not particularly limited. For example, the display panel DP may be an organic light emitting display panel or an inorganic light emitting display panel. An emissive layer of the organic light emitting display panel may include an organic luminescent material. An emissive layer of the inorganic light emitting display panel may include quantum dots, quantum rods, and the like.

The display module DM may include the active area AA and the peripheral area NAA. The active area AA may be an area that provides the image IM (refer to FIG. 1A). The pixels PX may be disposed in the active area AA. The peripheral area NAA may be adjacent to the active area AA. The peripheral area NAA may surround the active area AA. The drive circuit or drive wiring for driving the active area AA may be disposed in the peripheral area NAA.

The window WM may cover the entire upper surface of the display module DM. The window WM may have a shape corresponding to the shape of the display module DM. The window WM may have flexibility so as to be deformed depending on folding or bending of the display device DD. The window WM may function to protect the display module DM from external impact.

The window WM may include an optically clear insulating material. The window WM may be a glass substrate or a polymer substrate. In an embodiment, the window WM may be formed of glass. For example, the window WM may be a glass substrate, at least a portion of which is chemically strengthened. In an embodiment, the window WM may be formed of glass and may be used as a cover window of the display device DD.

The window WM may include a transmissive area TA and a bezel area BZA. The transmissive area TA may overlap at least a portion of the active area AA of the display module DM. The transmissive area TA may be an optically transparent area. For example, the transmissive area TA may have a transmittance of about 90% or more for wavelengths in the visible light region. The image IM (refer to FIG. 1A) may be provided to the user through the transmissive area TA, and the user may receive information through the image IM (refer to FIG. 1A).

The bezel area BZA may be an area having a lower light transmittance than the transmissive area TA. The bezel area BZA may define the shape of the transmissive area TA. The bezel area BZA may have a certain color. The bezel area BZA may cover the peripheral area NAA of the display module DM to interrupt visibility of the peripheral area NAA from the outside. Meanwhile, this is illustrative, and in the window WM according to an embodiment, the bezel area BZA may be omitted.

The display device DD of one embodiment may further include an adhesive layer AP-M (refer to FIG. 5B) disposed between the display module DM and the window WM.

In the display device DD of one embodiment, the window WM may include an optically clear insulating material. The window WM may be a glass substrate or a polymer substrate. In an embodiment, the window WM may be formed of glass. For example, the window WM may be a glass substrate, at least a portion of which is chemically strengthened. In an embodiment, the window WM may be formed of glass and may be used as a cover window of the display device DD.

Referring to FIGS. 4A and 4B, the window WM may include a first non-folding part NFP1, a folding part FP, and a second non-folding part NFP2 arranged in the second direction DR2.

As described above, the display device DD may include the folding area FA1 (refer to FIG. 1A) that is foldable about the folding axis FX1 defined in a direction parallel to the first direction DR1 and the first non-folding area NFA1 (refer to FIG. 1A) and the second non-folding area NFA2 (refer to FIG. 1A) spaced apart from each other in the second direction DR2 with the folding area FA1 (refer to FIG. 1A) therebetween. The first non-folding part NFP1, the second non-folding part NFP2, and the folding part FP of the window WM may be disposed at positions that correspond to the first non-folding area NFA1 (refer to FIG. 1A), the second non-folding area NFA2 (refer to FIG. 1A), and the folding area FA1 (refer to FIG. 1A) described above. That is, the first non-folding part NFP1, the folding part FP, and the second non-folding part NFP2 may be arranged in the second direction DR2 and may overlap the first non-folding area NFA1 (refer to FIG. 1A), the folding area FA1 (refer to FIG. 1A), and the second non-folding area NFA2 (refer to FIG. 1A), respectively.

The folding part FP may include a pattern portion PT-FP. A plurality of grooves HO (refer to FIG. 5B) may be defined in the pattern portion PT-FP. The plurality of grooves HO (refer to FIG. 5B) may define closed lines, respectively, and may form an irregular pattern UPT (refer to FIG. 7A) in the folding part FP. Description thereabout will be given below with reference to FIG. 7A. The irregular pattern UPT (refer to FIG. 7A) may represent an aperiodic pattern.

In an embodiment, the display module DM includes at least the display panel DP. The display panel DP may be an emissive display panel and is not particularly limited. For example, the display panel DP may be an organic light emitting display panel or an inorganic light emitting display panel. An emissive layer of the organic light emitting display panel may include an organic luminescent material. An emissive layer of the inorganic light emitting display panel may include quantum dots, quantum rods, and the like.

The display module DM may further include an input sensor TP. The input sensor TP may be directly disposed on the display panel DP. The input sensor TP may include a plurality of sensing electrodes. The input sensor TP may sense an external input using a self-cap method or a mutual-cap method. The input sensor TP may sense an input by an input device of an active type.

The input sensor TP may be directly formed on the display panel DP through a continuous process when the display panel DP is manufactured. However, embodiments are not limited thereto, and the input sensor TP may be manufactured as a panel separate from the display panel DP and may be attached to the display panel DP by an adhesive layer (not illustrated).

In the display device DD according to an embodiment, the lower module SM may include a support plate MP and a lower support member SPM.

The support plate MP may be disposed under the display module DM. In an embodiment, the support plate MP may include a metallic material or a polymer material. For example, the support plate MP may be formed of stainless steel, aluminum, or an alloy thereof. Alternatively, the support plate MP may be formed of a polymer material. The support plate MP may have a plurality of openings OP defined therein. The support plate MP may include an opening pattern including the plurality of openings OP.

The lower support member SPM may be a part overlapping most of the area of the display module DM. The lower support member SPM may include at least one of a support layer, a cushion layer, a shielding layer, or an interlayer bonding layer. Meanwhile, without being limited to that disclosed, the configuration of the lower support member SPM may vary depending on the size or shape of the display device DD or operating characteristics of the display device DD.

The display device DD of one embodiment may further include an adhesive layer AP disposed between the display module DM and the lower module SM. The adhesive layer AP may be an optically clear adhesive (OCA) film or an optically clear adhesive resin (OCR) layer.

Figure 5A:
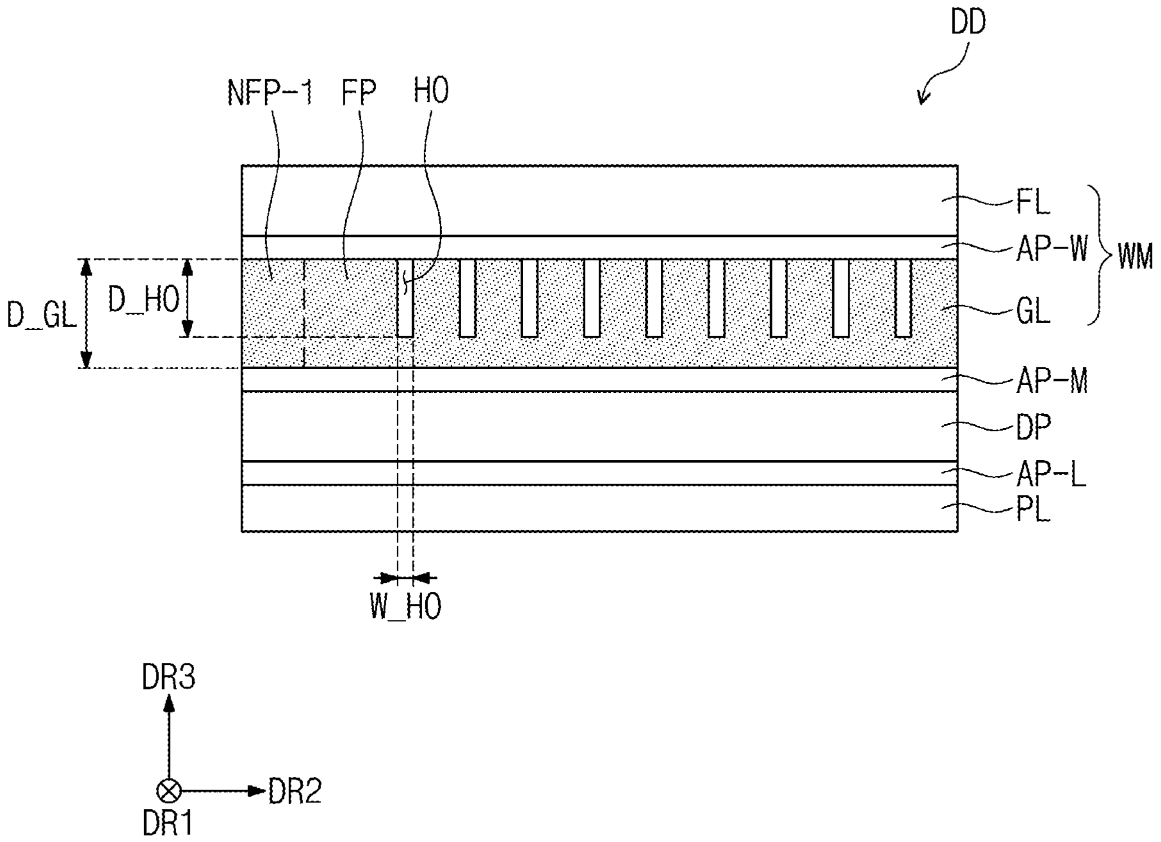
FIGS. 5A and 5B are sectional views of the display device according to an embodiment of the present disclosure.
Figure 5B:
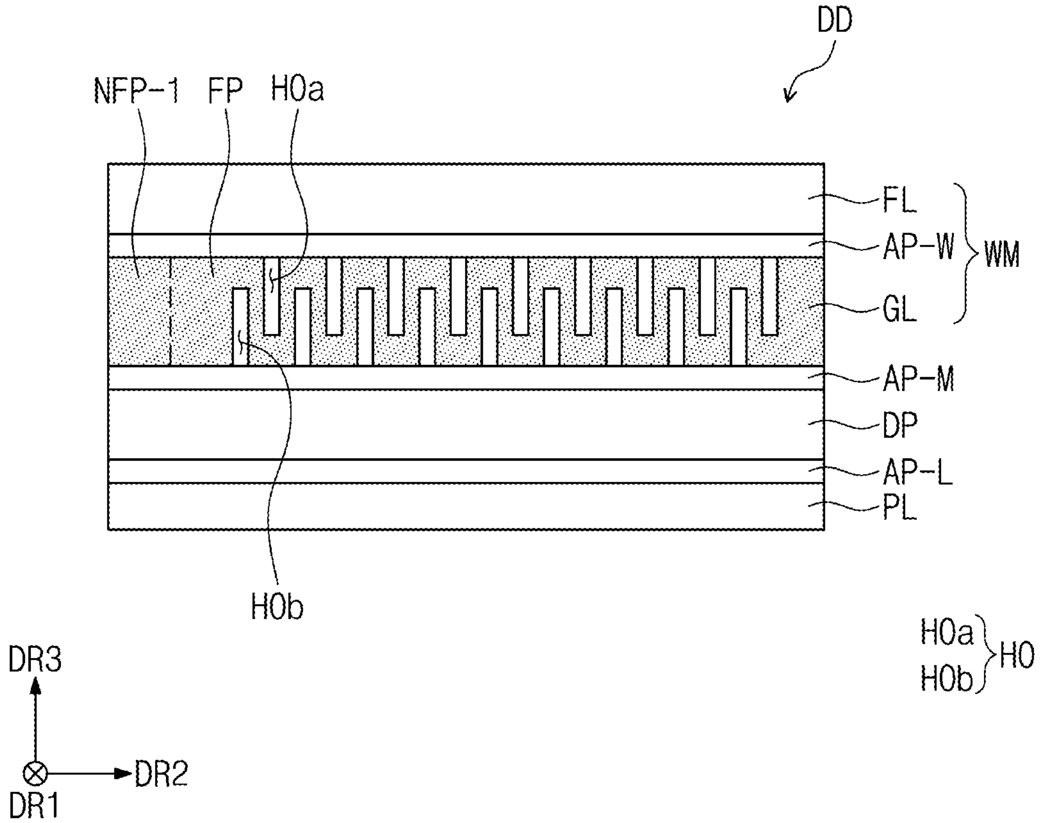

FIGS. 5A and 5B are sectional views of the display device DD according to an embodiment of the present disclosure. FIG. 5A is a sectional view illustrating a portion of a sectional view taken along line II-II' of FIG. 4A. FIG. 5B is a schematic sectional view illustrating another embodiment of the portion of a sectional view taken along line II-II' of FIG. 4A.

The window WM may include a glass cover GL and a cover film FL.

The glass cover GL may be disposed on the display panel DP. The glass cover GL may cover the display panel DP. The glass cover GL may protect the display panel DP. When the display device DD is folded or unfolded, the display panel DP and the glass cover GL may be folded or unfolded.

The glass cover GL may include an upper surface facing the display panel DP and a lower surface facing away from the upper surface. The grooves HO may be defined on the upper or lower surface of the glass cover GL.

As illustrated in the drawing, the grooves HO may be defined on the upper surface of the glass cover GL. However, without being limited thereto, the grooves HO may be defined on the lower surface of the glass cover GL, and the present disclosure is not limited to any one embodiment.

The grooves HO may overlap the folding part FP. The grooves HO may extend in the thickness direction of the glass cover GL. Since the grooves HO are defined on the glass cover GL, the glass cover GL may be easily folded or unfolded when the display device DD is folded or unfolded.

The plurality of grooves HO may be provided. The plurality of grooves HO may be filled with a filling portion FM (refer to FIG. 9A). The impact resistance and flexibility of the glass cover GL may be improved by filling the grooves HO with the filling portion FM (refer to FIG. 9A).

The cover film FL may be disposed on the glass cover GL. The cover film FL may cover the glass cover GL. The cover film FL may protect the glass cover GL.

However, without being limited thereto, an adhesive layer may be omitted, and the glass cover GL may make direct contact with the display DP, or the cover film FL may make direct contact with the glass cover GL. The present disclosure is not limited to any one embodiment.

The glass cover GL may have a thickness D_GL of 50 micrometers (μm) to 150 micrometers (μm). The thickness D_GL of the glass cover GL may be 50 micrometers (μm) or more, and the grooves HO may not penetrate the glass cover GL. Alternatively, the thickness D_GL of the glass cover GL may be 150 micrometers (μm) or less, and the glass cover GL may be prevented from being excessively thickened. Accordingly, folding characteristics may be effectively improved. The folding part FP may have a width of 6.6 mm or less in the second direction DR2.

The grooves HO may each have a width W_HO of 50 micrometers (μm) to 100 micrometers (μm). Specifically, the length W_HO of each of the grooves HO in the second direction DR2 may range from 50 micrometers (μm) to 100 micrometers (μm). The grooves HO may have a depth D_HO of 50 micrometers (μm) to 100 micrometers (μm).

In the drawing, for convenience of description, the width W_HO of each of the grooves HO is illustrated as being smaller than the actual value. However, the width W_HO of each of the grooves HO is substantially the same as the thickness D_GL of the glass cover GL, and there may not be a significant difference therebetween.

However, the above numerical value may vary depending on the size or shape of the display device DD or the operating characteristics of the display device DD.

A protective layer PL may be provided under the display panel DP. The protective layer PL may protect the display panel DP. As illustrated in the drawing, the protective layer PL may be attached to the display panel DP through a lower adhesive layer AP-L. However, without being limited to that illustrated in the drawing, the lower adhesive layer AP-L may be omitted, and the protective layer PL may be provided as a functional layer. The present disclosure is not limited to any one embodiment.

Referring to FIG. 5B, the grooves HO may be defined on both the upper and lower surfaces of the glass cover GL.

First grooves HOa defined on the upper surface of the glass cover GL and second grooves HOb defined on the lower surface of the glass cover GL do not overlap each other in a plan view. Since the first grooves HOa and the second grooves HOb do not overlap each other in a plan view, the depths of the grooves HO may be prevented from being excessively deep.

In addition, as will be described below, the first grooves HOa and the second grooves HOb may form different closed lines CLN (refer to FIG. 7A), and irregular patterns UPT (refer to FIG. 7A) formed by the closed lines CLN (refer to FIG. 7A) may be different from one another. However, without being limited thereto, the irregular patterns UPT (refer to FIG. 7A) formed by the closed lines CLN (refer to FIG. 7A) may be similar patterns and are not limited to any one embodiment.

Figure 6:
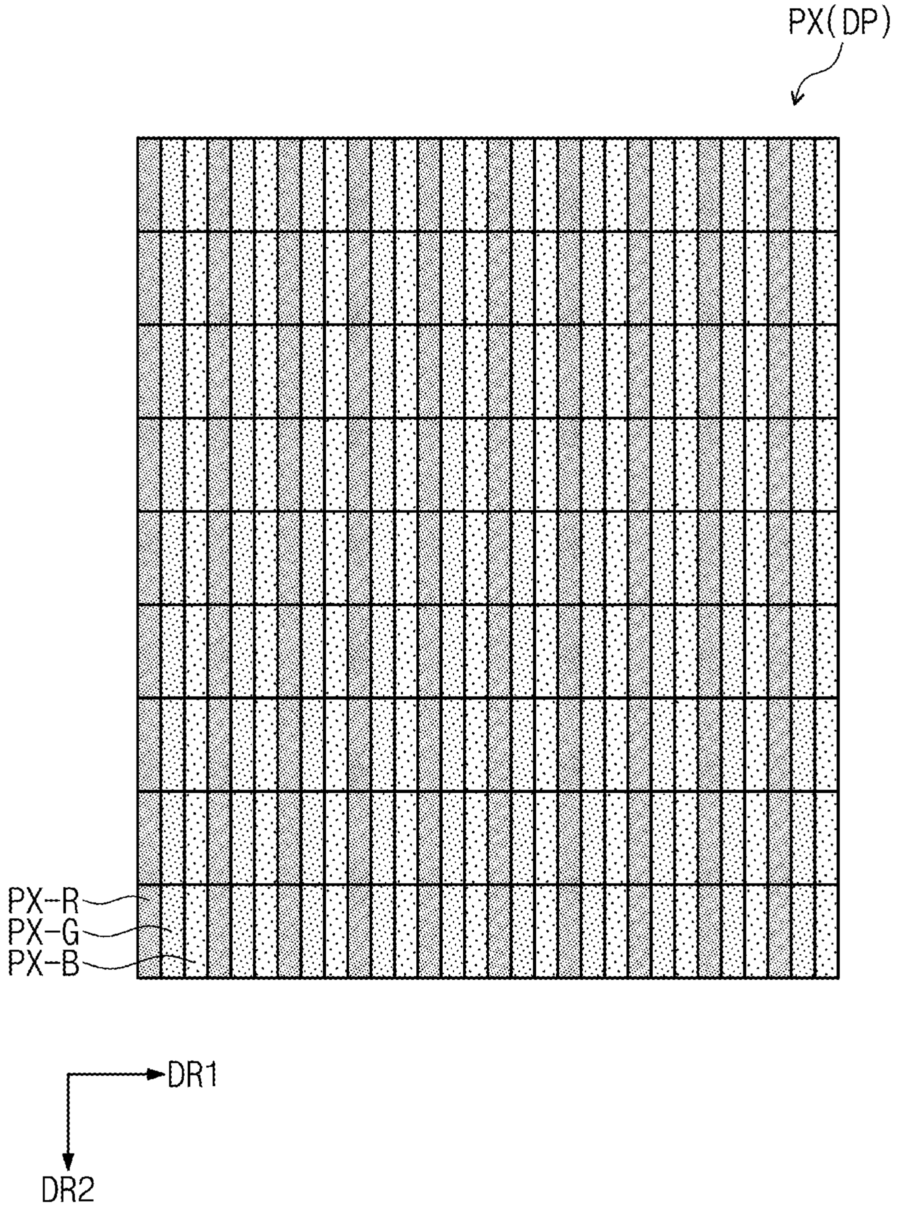
FIG. 6 is an enlarged plan view of a display panel according to an embodiment of the present disclosure.

FIG. 6 is an enlarged plan view of the display panel DP according to an embodiment of the present disclosure.

Referring to FIG. 6, the display panel DP may include the plurality of pixels PX. The plurality of pixels PX may include a first color light emitting element PX-R, a second color light emitting element PX-G, and a third color light emitting element PX-B.

According to an embodiment, the first color light emitting element PX-R, the second color light emitting element PX-G, and the third color light emitting element PX-B may be arranged in the first direction DR1.

That is, the light emitting elements PX-R, PX-G, and PX-B of the plurality of pixels PX may be regularly arranged. In other words, the plurality of pixels PX may form a regular pattern. However, without being limited to that illustrated in the drawing, the first color light emitting element PX-R and the second color light emitting element PX-G may be spaced apart from each other in the second direction DR2, and the first color light emitting element PX-R and the second color light emitting element PX-G may be spaced apart from the third color light emitting element PX-B in the first direction DR1. Alternatively, the light emitting elements PX-R, PX-G, and PX-B may be arranged in an S-Stripe manner and are not limited to any one embodiment.

In this case, in the folding area FA1 (refer to FIG. 1A) and the non-folding areas NFA1 and NFA2 (refer to FIG. 1A), the plurality of pixels PX may form different regular patterns.

The present disclosure is not limited thereto, and in the folding area FA1 (refer to FIG. 1A) and the non-folding areas NFA1 and NFA2 (refer to FIG. 1A), the plurality of pixels PX may form a common regular pattern and are not limited to any one embodiment.

Since the pixels PX of the display panel DP form a regular pattern as illustrated in FIG. 6, a Moire interference phenomenon may occur when the grooves HO (refer to FIG. 5A) of the glass cover GL (refer to FIG. 5A) are also formed in a regular pattern. For example, due to the periodic arrangement of the pixels PX and the periodic arrangement of the grooves HO (refer to FIG. 5A), a pattern larger than the period occurring in each arrangement may be formed. When the Moire interference phenomenon occurs as described above, the display quality of the display device DD (refer to FIG. 5A) may be deteriorated.

Figure 7A:
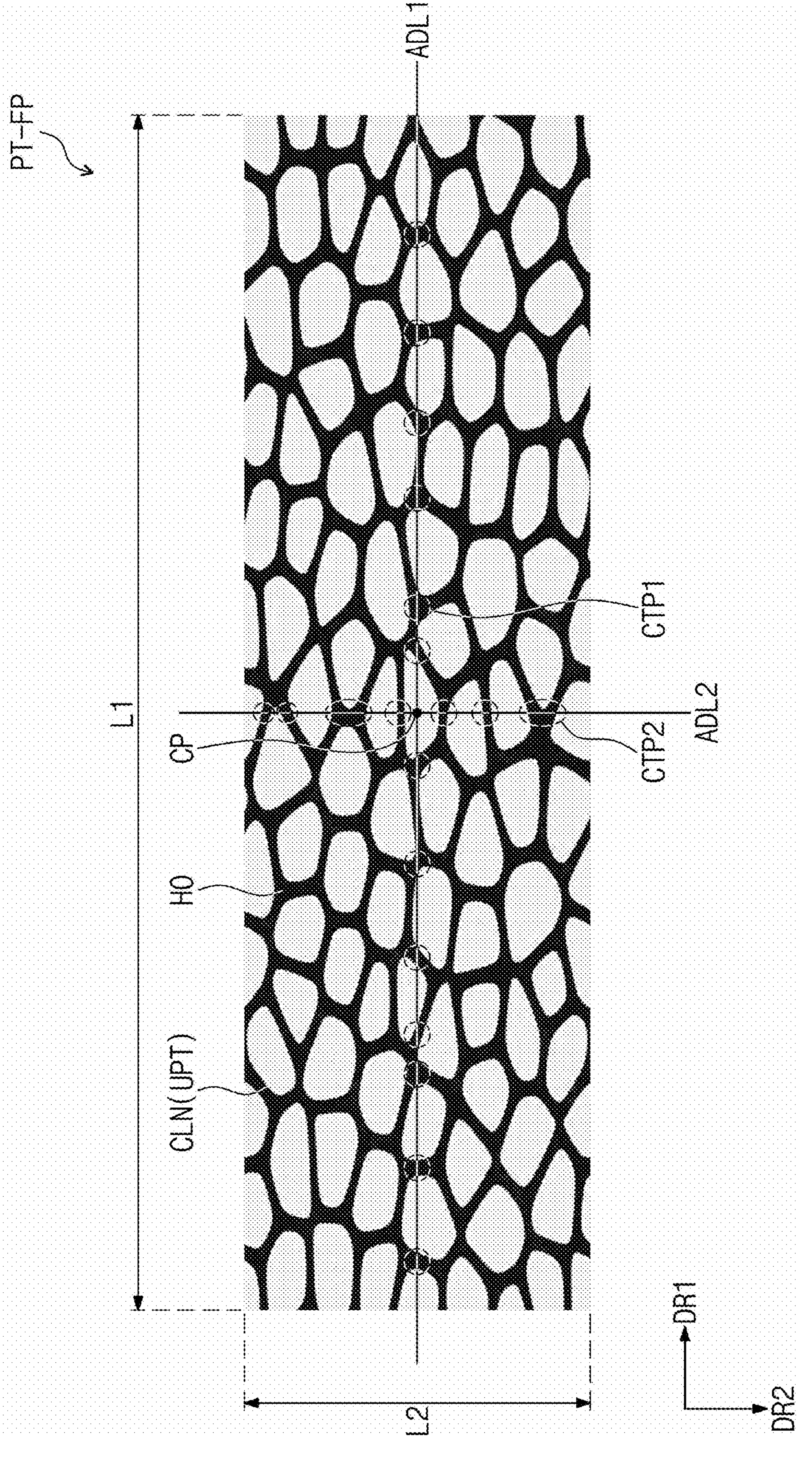
FIG. 7A is an enlarged plan view of a glass cover according to an embodiment of the present disclosure.
Figure 7B:
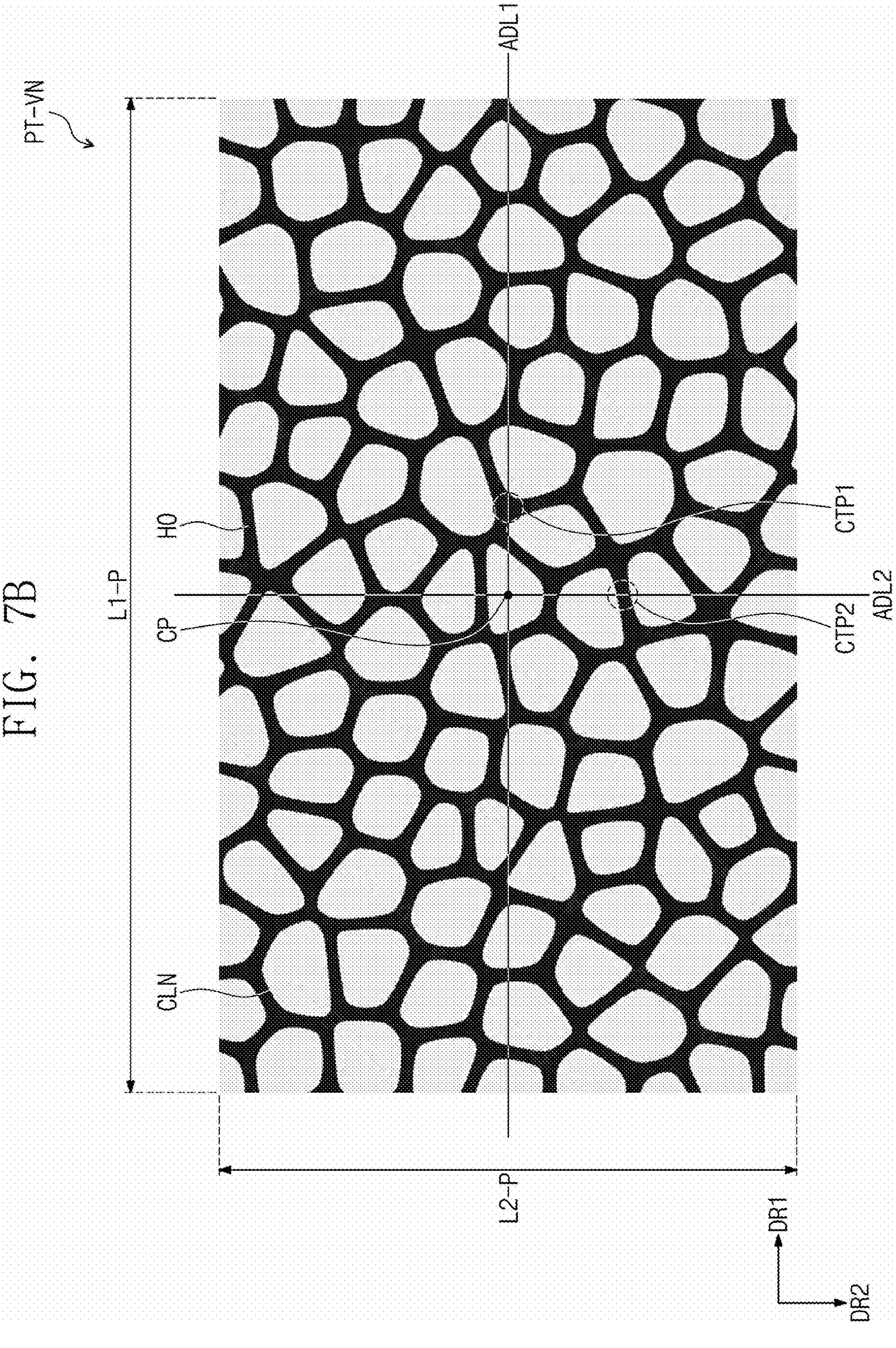
FIG. 7B is an enlarged plan view of a Voronoi pattern.

FIG. 7A is an enlarged plan view of the glass cover according to an embodiment of the present disclosure, and FIG. 7B is an enlarged plan view of a Voronoi pattern according to an embodiment. Specifically, FIG. 7A is an enlarged plan view of the pattern portion PT-FP of the folding part FP (refer to FIG. 4B) illustrated in FIG. 4B.

Referring to FIG. 7A, the folding part FP (refer to FIG. 4B) may include the plurality of grooves HO that define the closed lines CLN, respectively. The closed lines CLN may form the irregular pattern UPT.

The pixels PX (refer to FIG. 6) overlapping the folding area FA1 (refer to FIG. 1A) may form a regular pattern, and in the folding part FP (refer to FIG. 4B), the closed lines CLN may form the irregular pattern UPT. Accordingly, a Moire interference phenomenon may not occur. Thus, the display quality of the display device DD (refer to FIG. 4B) may be effectively prevented from being deteriorated.

The plurality of grooves HO may be connected together to have a one-body shape. In this case, the irregular pattern UPT formed by the closed lines CLN may have a net shape.

Referring to FIG. 7B, per unit length, the number of portions CTP1 where a first line ADL1 extending in the first direction DR1 and passing through the center point CP of the folding part FP (refer to FIG. 4B) overlaps the grooves HO may be equal to the number of portions CTP2 where a second line ADL2 extending in the second direction DR2 and passing through the center point CP of the folding part FP (refer to FIG. 4B) overlaps the grooves HO. For example, referring to FIG. 7B, the number of portions CTP1 where the first line ADL1 overlaps the grooves HO and the number of portions CTP2 where the second line ADL2 overlaps the grooves HO may each be equal to 7 for the same length.

Meanwhile, per unit length, the number of portions where the first line ADL1 extending in the first direction DR1 and passing through portions other than the center point CP overlaps the grooves HO may be substantially the same as the number of portions where the second line ADL2 extending in the second direction DR2 and passing through portions other than the center point CP overlaps the grooves HO. That is, the numbers of portions where the first line ADL1 and the second line ADL2 overlap the grooves HO when passing through the center point CP of the folding part FP (refer to FIG. 4B) may be substantially the same as the numbers of portions where the first line ADL1 and the second line ADL2 overlap the grooves HO when passing through portions other than the center point CP of the folding part FP (refer to FIG. 4B), but there may be a slight difference therebetween.

The number of grooves HO per unit length that overlap the first line ADL1 may be defined as a first reference ratio, and the number of grooves HO per unit length that overlap the second line ADL2 may be defined as a second reference ratio. The first reference ratio may be smaller than the second reference ratio. In other words, the second reference ratio may be greater than the first reference ratio.

By making the first reference ratio smaller than the second reference ratio or making the second reference ratio greater than the first reference ratio, the number of closed lines CLN per unit length overlapping the second line ADL2 may be greater than the number of closed lines CLN per unit length overlapping the first line ADL1.

At the same length, the number of closed lines CLN overlapping the second line ADL2 extending in the second direction DR2 crossing the folding axis may be greater than the number of closed lines CLN overlapping the first line ADL1 extending in the first direction DR1 parallel to the folding axis, and thus folding characteristics may be effectively improved.

According to an embodiment of the present disclosure, the ratio of the second reference ratio to the first reference ratio may be greater than 1 and less than or equal to 5. For example, when the ratio of the second reference ratio to the first reference ratio is greater than 1, the number of closed lines CLN overlapping the second line ADL2 per unit length may be greater than the number of closed lines CLN overlapping the first line ADL1 per unit length, and thus folding characteristics may be effectively improved.

When the ratio of the second reference ratio to the first reference ratio is less than or equal to 5, the number of closed lines CLN overlapping the first line ADL1 per unit length may be prevented from being significantly different from the number of closed lines CLN overlapping the second line ADL2 per unit length, and thus the irregular pattern UPT may be prevented from locally having a regular pattern in the first direction DR1.

The irregular pattern UPT illustrated in FIG. 7A may correspond to a pattern obtained by modifying the aspect ratio of another irregular pattern UPT. According to an embodiment of the present disclosure, the irregular pattern UPT illustrated in FIG. 7A may correspond to a pattern obtained by modifying the aspect ratio of the Voronoi pattern, which will be described with reference to FIG. 7B, to 1:n (n being a number greater than 1). The aspect ratio may be defined as a ratio of a length L2 in the second direction DR2 to a length L1 in the first direction DR1 of the modified Voronoi pattern.

For example, the irregular pattern UPT formed in the pattern portion PT-FP illustrated in FIG. 7A may correspond to a pattern obtained by modifying the Voronoi pattern PT-VN (refer to FIG. 7B) in the first direction DR1. Specifically, the length L1 of the irregular pattern UPT of FIG. 7A in the first direction DR1 may be twice the length L1-P of the Voronoi pattern PT-VN of FIG. 7B in the first direction DR1. In this case, the length L2 of the irregular pattern UPT of FIG. 7A in the second direction DR2 may correspond to the length L2-P of the Voronoi pattern PT-VN of FIG. 7B in the second direction DR2.

In other word, the length L2 of the irregular pattern UPT of FIG. 7A in the second direction DR2 may be 0.5 times the length L2-P of the Voronoi pattern PT-VN of FIG. 7B in the second direction DR2. In this case, the length L1 of the irregular pattern UPT of FIG. 7A in the first direction DR1 may correspond to the length L1-P of the Voronoi pattern PT-VN of FIG. 7B in the first direction DR1.

According to an embodiment of the present disclosure, when n is a number greater than 1, the number of closed lines CLN overlapping the second line ADL2 per unit length may be greater than the number of closed lines CLN overlapping the first line ADL1 per unit length, and thus folding characteristics may be effectively improved.

When n is less than or equal to 5, isotropic characteristics of the Voronoi pattern PT-VN (refer to FIG. 7B) may be prevented from being excessively deteriorated, and thus Moire interference may be prevented from occurring in relation to the regular pattern of the pixels PX (refer to FIG. 6).

The Voronoi pattern PT-VN illustrated in FIG. 7B is an irregular pattern having isotropic characteristics. For example, the Voronoi pattern PT-VN illustrated in FIG. 7B may be formed of Voronoi diagrams formed for a plurality of points (generating points, not shown here) arranged on the plane and may be an irregular pattern having a net shape. The Voronoi pattern PT-VN illustrated in FIG. 7B may be an irregular pattern having isotropic characteristics.

The pattern portion PT-FP illustrated in FIG. 7A may be formed by modifying the aspect ratio of the Voronoi pattern PT-VN of FIG. 7B having isotropic characteristics to 1:n. By extending the Voronoi pattern PT-VN in the first direction DR1 parallel to the folding axis, the number of closed lines CLN per unit length overlapping the first line ADL1 may be relatively large when compared to the number of closed lines CLN per unit length overlapping the second line ADL2. Accordingly, the folding characteristics of the display device may be effectively improved.

That is, the number of closed lines per unit length in a direction parallel to the folding axis may be greater than the number of closed lines per unit length in a direction crossing the folding axis. By increasing the number of closed lines in the direction parallel to the folding axis per unit length, the amount of resin accommodated in the closed lines may be increased, and thus the folding characteristics may be effectively improved.

A Voronoi pattern PT-VN that is able to be used in the present disclosure is not limited to the Voronoi pattern PT-VN illustrated in FIG. 7B, and Voronoi patterns PT-VN formed using various numerical values and algorithms may be used.

In addition, without being limited thereto, an aperiodic tessellation pattern may be used instead of a Voronoi pattern PT-VN, and the present disclosure is not limited to any one embodiment.

Figure 8A:
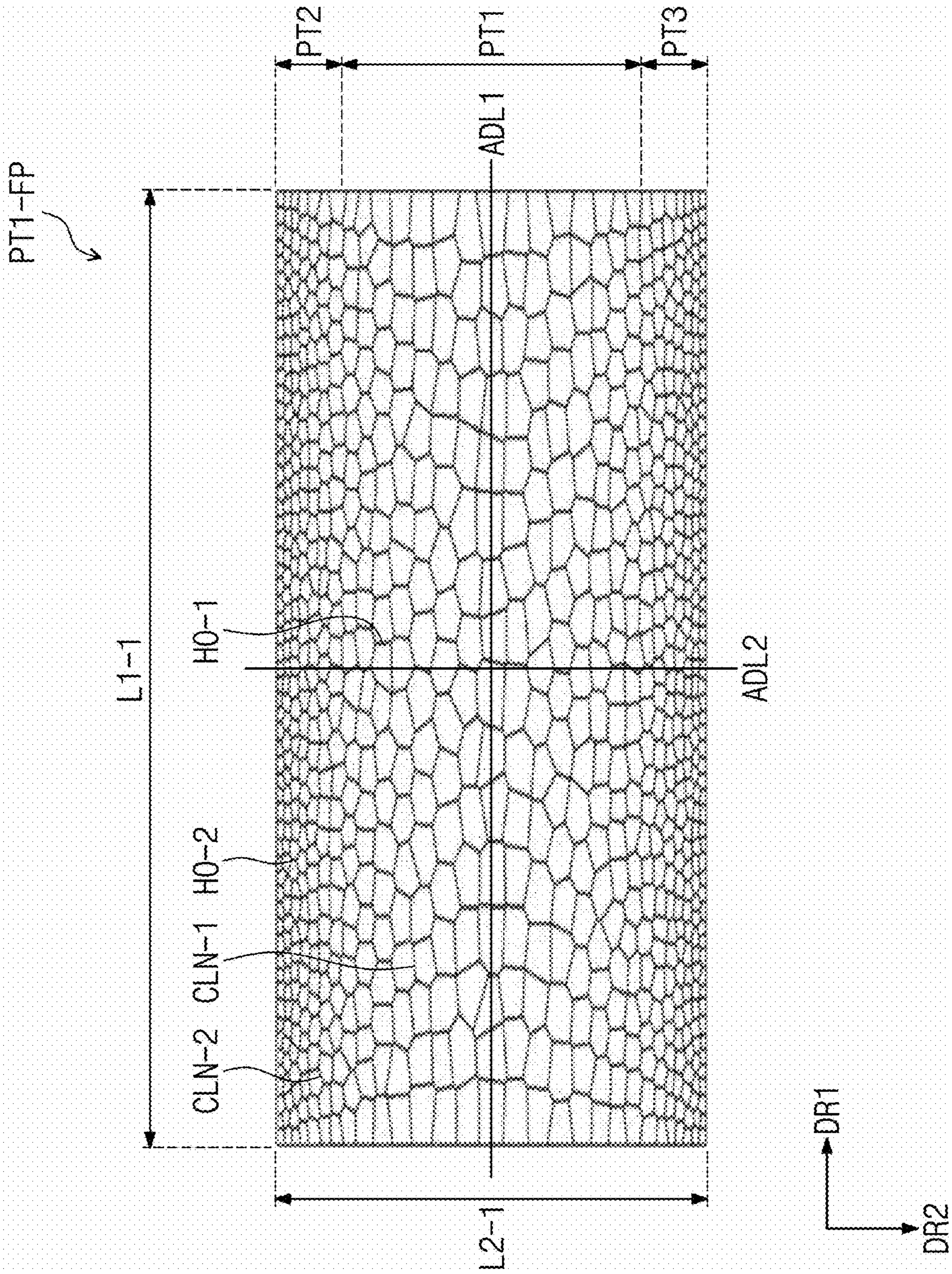
FIG. 8A is an enlarged plan view of a glass cover according to an embodiment of the present disclosure.
Figure 8B:
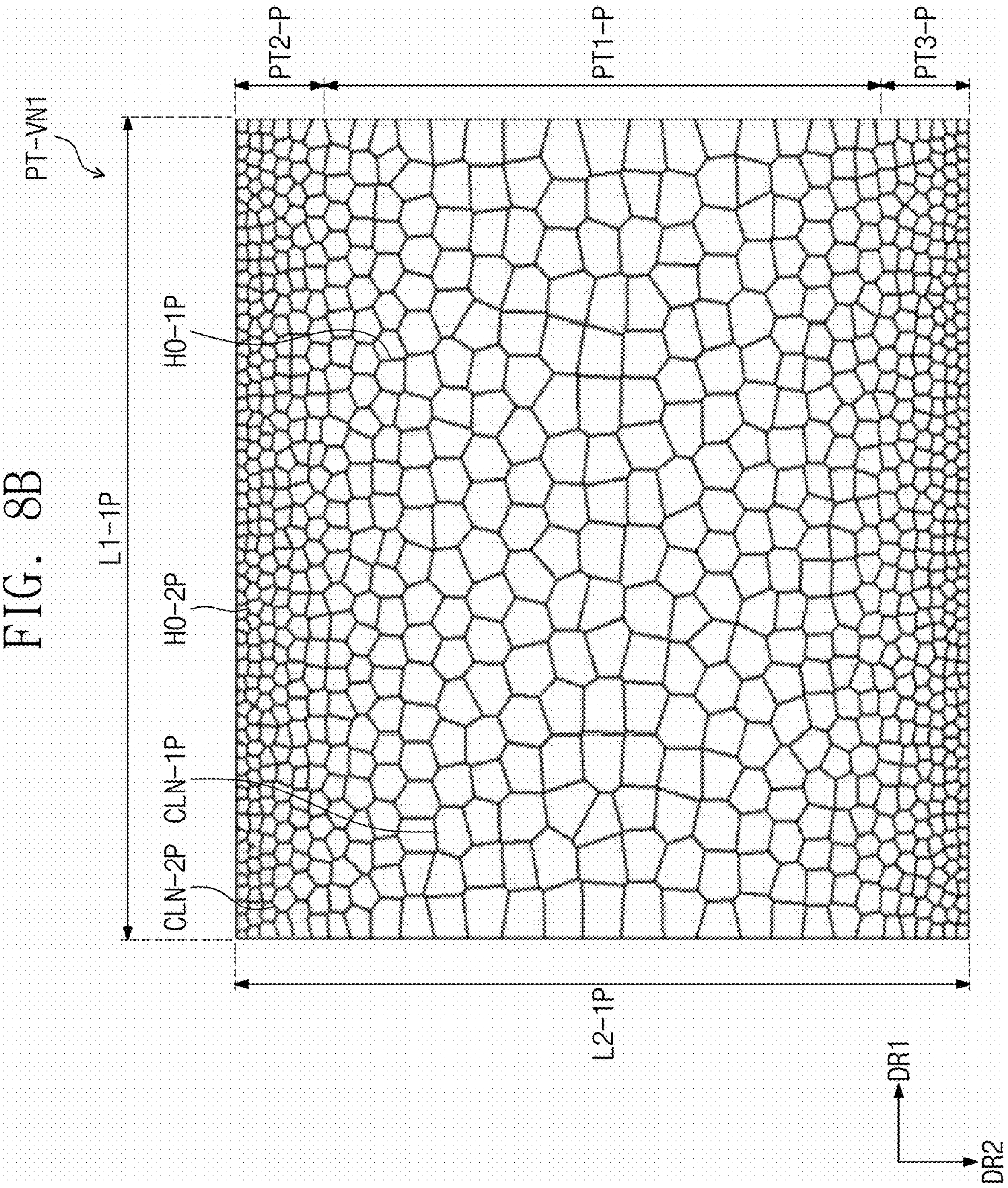
FIG. 8B is an enlarged plan view of a Voronoi pattern.

FIG. 8A is an enlarged plan view of a glass cover according to an embodiment of the present disclosure, and FIG. 8B is an enlarged plan view of a Voronoi pattern according to an embodiment.

Referring to FIG. 8A, the folding part FP (refer to FIG. 4B) may include a first portion PT1 adjacent to the folding axis FX1 (refer to FIG. 3) and a second portion PT2 farther away from the folding axis FX1 (refer to FIG. 3) than the first portion PT1. The density of closed lines CLN-1 in the first portion PT1 may be different from the density of closed lines CLN-2 in the second portion PT2.

In addition, the folding part FP (refer to FIG. 4B) may include a third portion PT3 spaced apart from the second portion PT2 with the first portion PT1 therebetween. The density of the closed lines CLN-1 in the first portion PT1 may be different from the density of closed lines in the third portion PT3. The density of the closed lines CLN-2 in the second portion PT2 may be equal to the density of the closed lines in the third portion PT3, but is not limited thereto.

Since the density of the closed lines CLN-1 in the first portion PT1 is different from the density of the closed lines CLN-2 in the second portion PT2, the bending characteristics of a first pattern PT1-P (refer to FIG. 8B) may be different from the bending characteristics of a second pattern PT2-P (refer to FIG. 8B). For example, the density of the closed lines CLN-1 in the first portion PT1 may be lower than the density of the closed lines CLN-2 in the second portion PT2, and thus the bending characteristics of the second pattern PT2-P (refer to FIG. 8B) may be greater than the bending characteristics of the first pattern PT1-P (refer to FIG. 8B).

In addition, the area (or, density) occupied by grooves HO-2 formed on the second portion PT2 may be greater than the area (or, density) occupied by grooves HO-1 formed on the first portion PT1. In this case, a filling portion FM accommodated in the grooves HO-2 of the second portion PT2 may be larger than a filling portion FM accommodated in the grooves HO-1 of the first portion PT1. Since the filling portion FM softer than the glass cover GL (refer to FIG. 5A) is able to be more easily accommodated in the second portion PT2 than in the first portion PT1, the bending characteristics of the second portion PT2 may be better than the bending characteristics of the first portion PT1.

In the drawing, the density of the closed lines CLN-1 in the first portion PT1 is illustrated as being lower than the density of the closed lines CLN-2 in the second portion PT2. However, without being limited thereto, the density of the closed lines CLN-1 in the first portion PT1 may be higher than or equal to the density of the closed lines CLN-2 in the second portion PT2, and the present disclosure is not limited to any one embodiment.

By adjusting the positions of patterns formed by the closed lines CLN-1 and CLN-2 that correspond to the first pattern PT1-P, the second pattern PT2-P, and the third pattern PT3-P, the positions of the patterns may be adjusted to facilitate folding and unfolding according to the curvature of the folding area FA (refer to FIG. 1A) of the display device DD (refer to FIG. 1A).

For example, during out-folding, the density of the closed lines CLN-1 in a portion close to the folding axis FX1 (refer to FIG. 3) may be made low to decrease the bending characteristics in a portion adjacent to the folding axis FX1 (refer to FIG. 3) and increase the bending characteristics in a portion away from the folding axis FX1 (refer to FIG. 3), and thus display device DD (refer to FIG. 4B) may be easily folded and unfolded.

FIG. 8B is an enlarged view of a Voronoi pattern PT-VN1 according to an embodiment. The pattern illustrated in FIG. 8B shows the case in which the different Voronoi patterns PT1-P, PT2-P, and PT3-P are formed in the second direction DR2.

The density of closed lines CLN-1P of the first pattern PT1-P of the Voronoi pattern PT-VN1 may be lower than the densities of closed lines CLN-2P of the second and third patterns PT2-P and PT3-P of the Voronoi pattern PT-VN1. The density of the closed lines CLN-2P of the second pattern PT2-P may be equal to the density of the closed lines of the third pattern PT3-P. Alternatively, without being limited thereto, the density of the closed lines CLN-2P of the second pattern PT2-P may be different from the density of the closed lines of the third pattern PT3-P.

A pattern obtained by modifying the aspect ratio of the first pattern PT1-P to 1:n may correspond to the pattern formed by the closed lines CLN-1 of the first portion PT1 illustrated in FIG. 8A. A pattern obtained by modifying the aspect ratio of the second pattern PT2-P to 1:n may correspond to the pattern formed by the closed lines CLN-2 of the second portion PT2 illustrated in FIG. 8A. A pattern obtained by modifying the aspect ratio of the third pattern PT3-P to 1:n may correspond to the pattern formed by the closed lines of the third portion PT3 illustrated in FIG. 8A.

For example, an irregular pattern formed in the pattern portion PT1-FP illustrated in FIG. 8A may correspond to a pattern obtained by modifying the Voronoi pattern PT-VN1 (refer to FIG. 8B) in the first direction DR1. Specifically, the length L1-1 of the irregular pattern of FIG. 8A in the first direction DR1 may be twice the length L1-1P of the Voronoi pattern PT-VN1 of FIG. 8B in the first direction DR1. In this case, the length L2-1 of the irregular pattern of FIG. 8A in the second direction DR2 may correspond to the length L2-1P of the Voronoi pattern PT-VN1 of FIG. 8B in the second direction DR2.

Figure 9A:
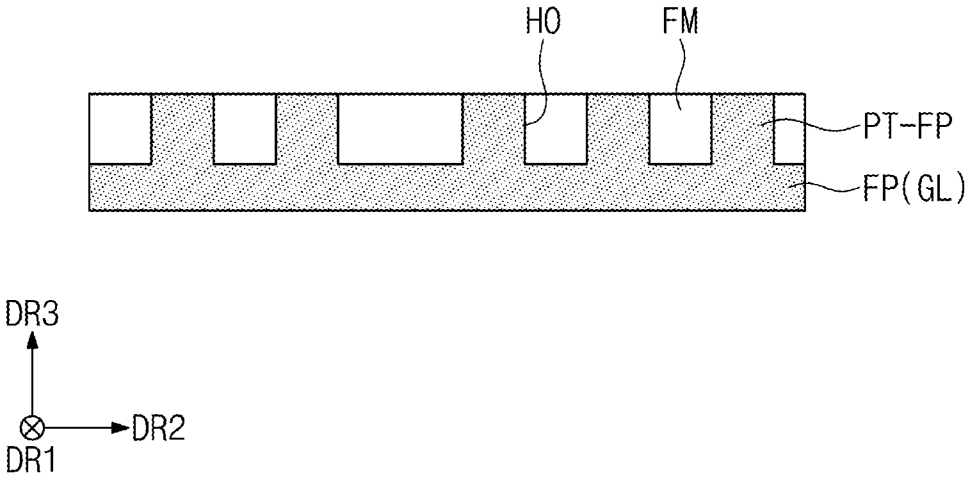
FIGS. 9A to 9C are sectional views of a glass cover according to an embodiment of the present disclosure.
Figure 9B:
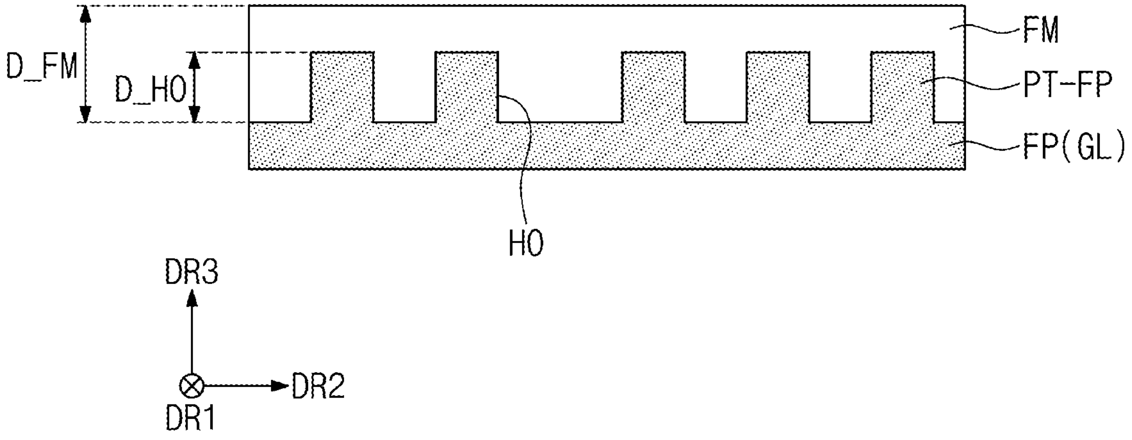
Figure 9C:
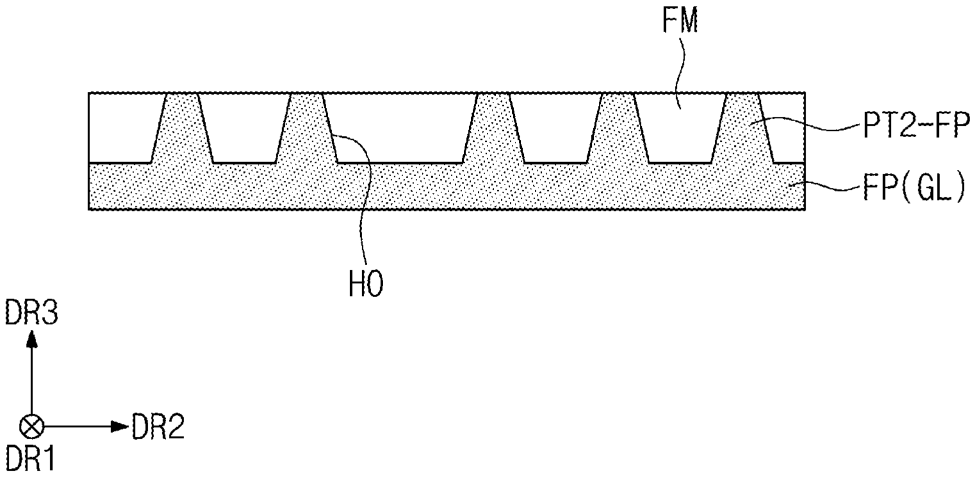

FIGS. 9A to 9C are sectional views of a glass cover according to an embodiment of the present disclosure.

Referring to FIG. 9A, the grooves HO of the glass cover GL may be filled with the filling portion FM.

The filling portion FM may include a resin. The filling portion FM may include at least one of an acrylate-based resin, a silicone-based resin, a urethane-based resin, or an epoxy-based resin. The impact resistance and flexibility of the glass cover GL may be improved by filling the grooves HO with the filling portion FM.

Referring to FIG. 9B, the thickness D_FM of the filling portion FM may be greater than the depth D_HO of the grooves. The filling portion FM may cover the pattern PT-FP formed by the closed lines CLN (refer to FIG. 7A). That is, the filling portion FM and the closed lines CLN (refer to FIG. 7A) may overlap each other in a plan view.

The filling portion FM may cover the closed lines CLN (refer to FIG. 7A), and thus the folding part FP may be smoothly folded and unfolded. Accordingly, the impact resistance and flexibility of the glass cover GL may be improved.

Referring to FIG. 9C, some of the grooves HO may have the same width, and other grooves HO may have different widths. That is, the distances between the closed lines CLN (refer to FIG. 7A) may be equal to or different from one another.

In addition, upper and lower sides of some of the grooves HO may have different widths. For example, the upper side may have a greater width than the lower side. The closed lines CLN (refer to FIG. 7A) may have a tapered shape on the section.

Figure 10:
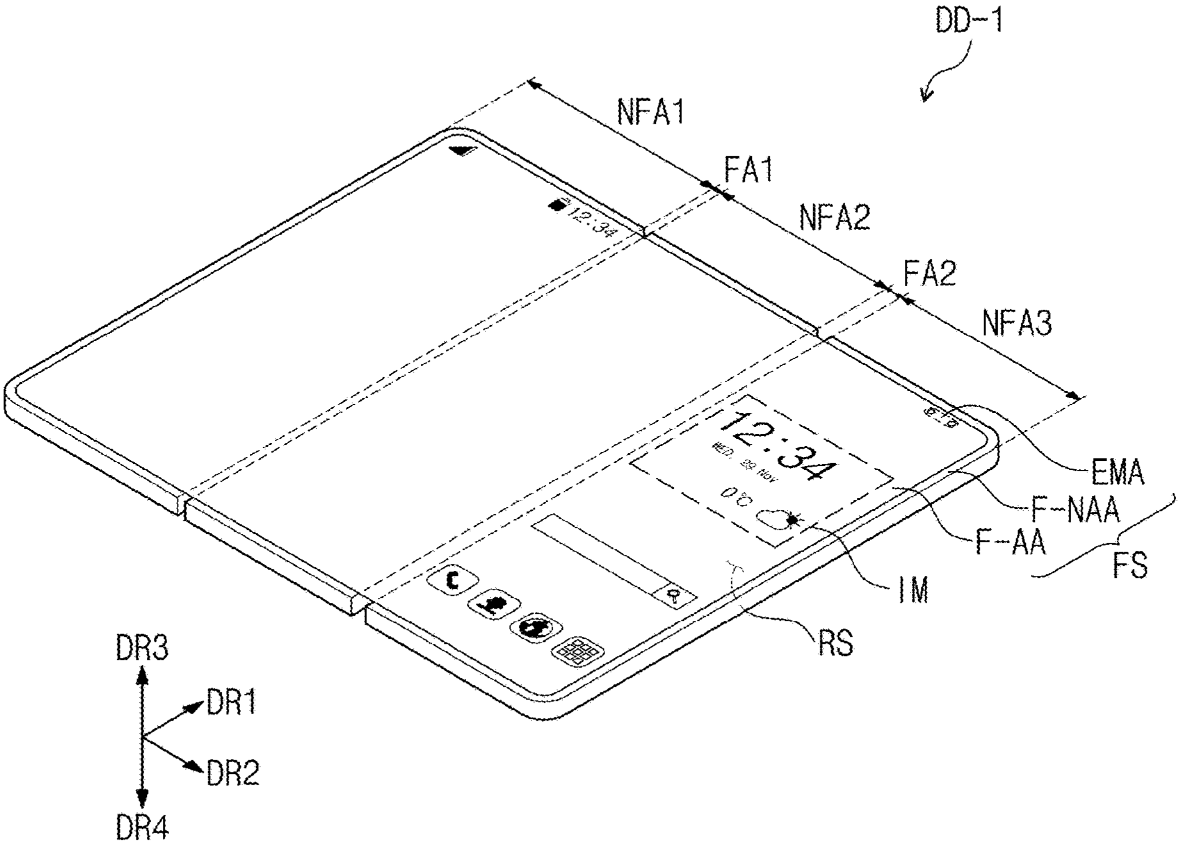
FIG. 10 is a perspective view illustrating an unfolded state of a display device according to an embodiment of the present disclosure.

FIG. 10 is a perspective view illustrating an unfolded state of a display device according to an embodiment of the present disclosure.

Referring to FIG. 10, the display device DD-1 according to an embodiment may include a display surface FS parallel to a plane defined by a first directional axis DR1 and a second directional axis DR2 crossing the first directional axis DR1 in the unfolded state. The display device DD-1 may provide an image IM to a user through the display surface FS. Hereinafter, front surfaces (or, upper surfaces) and rear surfaces (or, lower surfaces) of components are defined based on the direction in which the image IM is displayed, and the following description will be given based on this. In addition, the direction in which the image IM is displayed may be defined as the direction of a third directional axis DR3, and the direction of a fourth directional axis DR4 may be defined as the direction opposite to the direction of the third directional axis DR3.

The display surface FS of the display device DD-1 may include an active area F-AA and a peripheral area F-NAA. The active area F-AA may be an area activated depending on an electrical signal. The display device DD-1 according to an embodiment may display the image IM through the active area F-AA. In addition, the active area F-AA may sense various forms of external inputs. The peripheral area F-NAA is adjacent to the active area F-AA. The peripheral area F-NAA may have a certain color.

An electronic module area EMA may be included in the active area F-AA. Various electronic modules may be disposed in the electronic module area EMA. For example, the electronic modules may include at least one of a camera, a speaker, a light detection sensor, or a heat detection sensor. The electronic module area EMA may sense an external object received through the display surface FS, or may provide a sound signal, such as a voice, to the outside through the display surface FS. The electronic modules may include a plurality of components and are not limited to any one embodiment.

The electronic module area EMA may be surrounded by the active area F-AA and the peripheral area F-NAA. However, without being limited thereto, the electronic module area EMA may be disposed in the active area F-AA and is not limited to any one embodiment. When the electronic modules disposed in the electronic module area EMA are deactivated, the electronic module area EMA may display a video or image on the display surface.

The rear surface RS of the display device DD-1 of one embodiment may be a surface facing the display surface FS. In an embodiment, the rear surface RS may be an outside surface of the display device DD-1, and a video or image may not be displayed on the rear surface RS. However, embodiments are not limited thereto, and the rear surface RS may function as a second display surface on which a video or image is displayed. In addition, the display device DD-1 of one embodiment may further include an electronic module area disposed on the rear surface RS. A camera, a speaker, a light detection sensor, and the like may be disposed in the electronic module area disposed on the rear surface RS.

In the display device DD-1 of one embodiment, the peripheral area F-NAA may surround the active area F-AA. Accordingly, the shape of the active area F-AA may be substantially defined by the peripheral area F-NAA. However, this is illustrative, and the peripheral area F-NAA may be disposed adjacent to only one side of the active area F-AA, or may be omitted. The display device DD-1 according to an embodiment of the present disclosure may include active areas having various shapes and is not limited to any one embodiment.

The display device DD-1 of one embodiment may include folding areas FA1 and FA2 and non-folding areas NFA1, NFA2, and NFA3. The display device DD-1 may include the first non-folding area NFA1, the first folding area FA1, the second non-folding area NFA2, the second folding area FA2, and the third non-folding area NFA3 arranged side by side in one direction. The first non-folding area NFA1 and the second non-folding area NFA2 may be spaced apart from each other with the first folding area FA1 therebetween, and the second non-folding area NFA2 and the third non-folding area NFA3 may be spaced apart from each other with the second folding area FA2 therebetween. However, embodiments are not limited thereto. The number of folding areas and the number of non-folding areas are not limited to those illustrated, and the display device DD-1 may include three or more folding areas and four or more non-folding areas.

Figure 11:
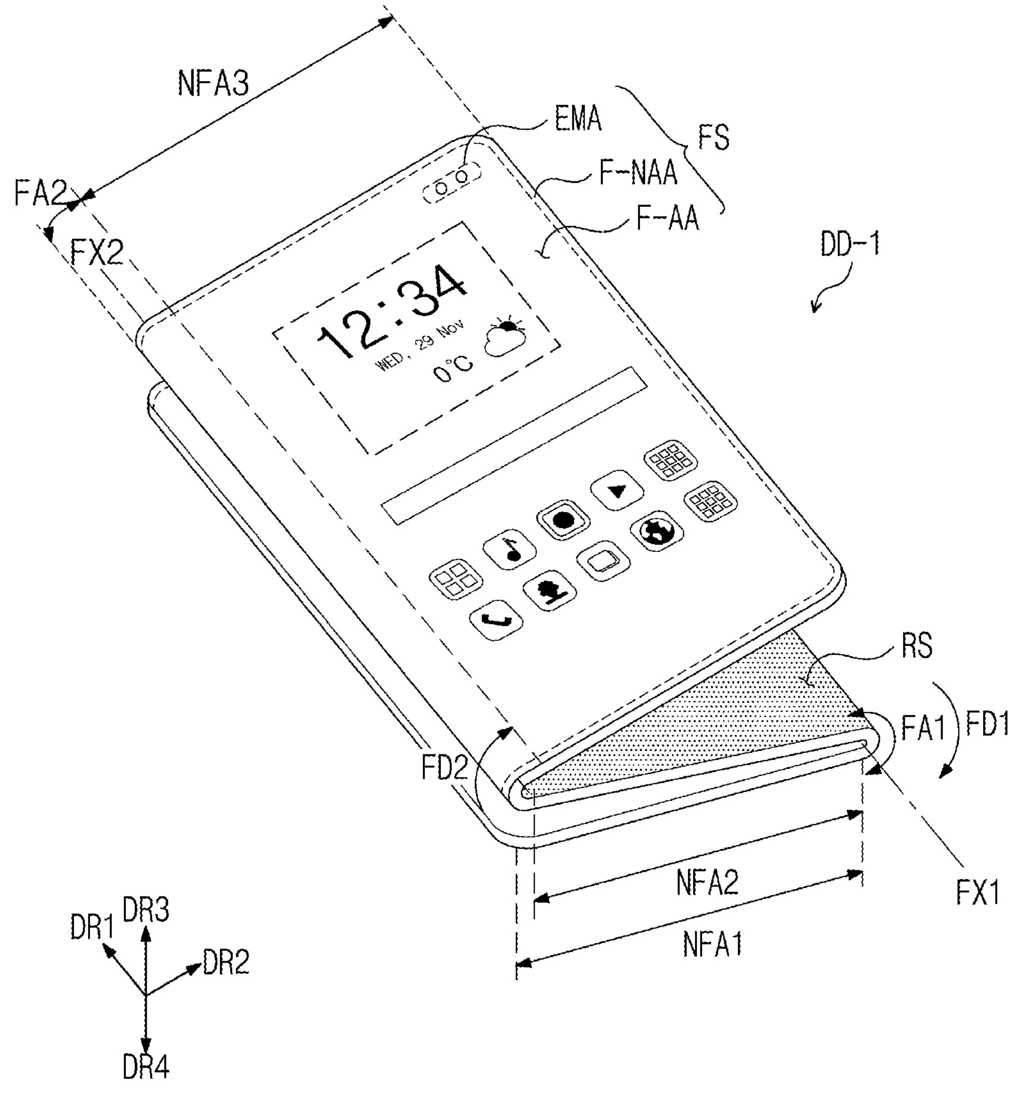
FIG. 11 is a perspective view illustrating a folding process of the display device according to an embodiment of the present disclosure.
Figure 12A:
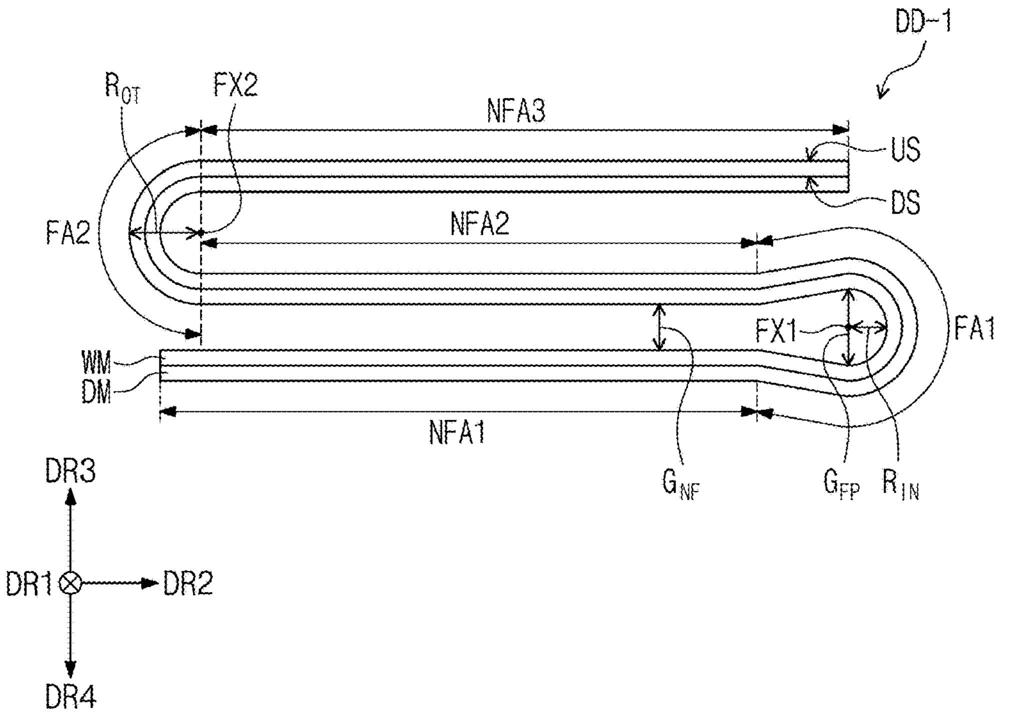
FIGS. 12A and 12B are sectional views illustrating a folded state of the display device according to an embodiment of the present disclosure.
Figure 12B:
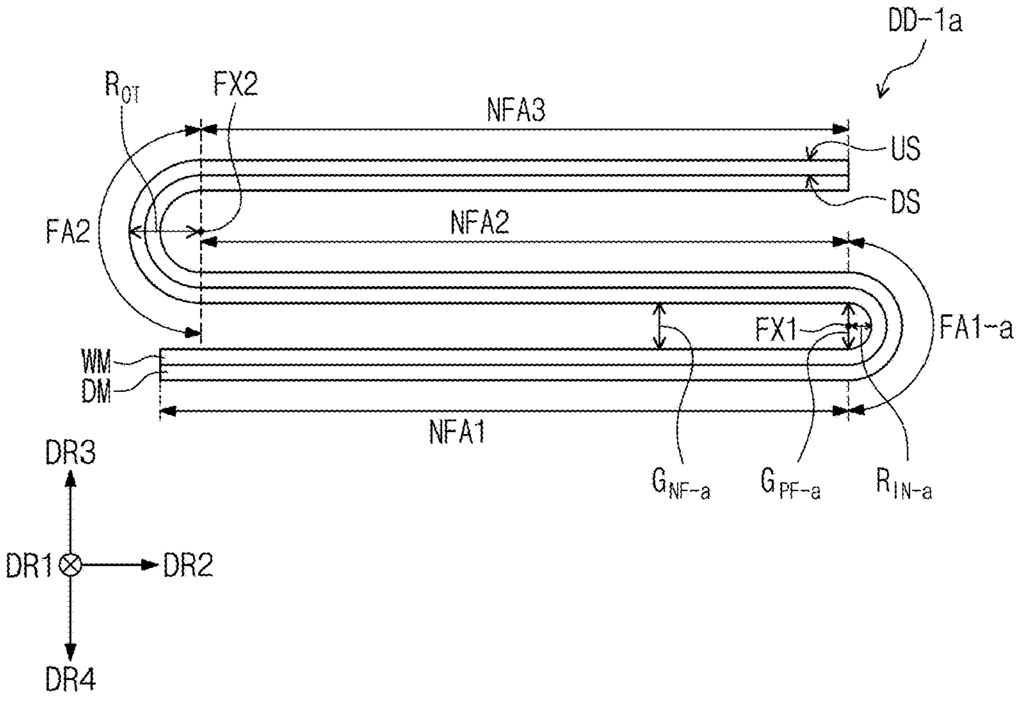

FIG. 11 is a perspective view illustrating a folding process of the display device DD-1 of one embodiment. FIG. 12A is a side view illustrating a folded state of the display device DD-1 according to an embodiment. FIG. 12B is a side view illustrating a folded state of a display device DD-1*a* according to an embodiment.

Referring to FIGS. 11 and 12A, the display device DD-1 of one embodiment may include the first folding area FA1 folded about a first folding axis FX1 parallel to the first directional axis DR1 and the second folding area FA2 folded about a second folding axis FX2 that is parallel to the first directional axis DR1 and is spaced apart from the first folding axis FX1. The second folding axis FX2 may be spaced apart from the first folding axis FX1 in the direction of the second directional axis DR2. However, embodiments are not limited thereto, and the first folding axis FX1 and the second folding axis FX2 may be parallel to each other in any direction rather than the direction of the first directional axis DR1.

In the display device DD-1 of one embodiment, the first folding area FA1 may be folded in a first folding direction FD1, and the second folding area FA2 may be folded in a second folding direction FD2. In an embodiment, the first folding direction FD1 may be a direction in which the first folding area FA1 is folded such that the display surface of the first non-folding area NFA1 and the display surface of the second non-folding area NFA2 are adjacent to each other and face each other, and the second folding direction FD2 may be a direction in which the second folding area FA2 is folded such that the display surface of the third non-folding area NFA3 is exposed to the outside.

The display device DD-1 of one embodiment may include a display module DM and a window WM. The window WM may be disposed on the display module DM. The window WM may form the display surface FS of the display device DD-1. The window WM may include a lower surface DS adjacent to the display module DM and an upper surface US facing the lower surface DS in the thickness direction.

In one embodiment illustrated in FIGS. 11 and 12A, the first folding axis FX1 may be a virtual axis extending in the direction of the first directional axis DR1 and may be located over the display surface FS. In addition, the second folding axis FX2 may be a virtual axis extending in the direction of the first directional axis DR1 and may be located under the rear surface RS.

In the display device DD-1 of one embodiment, the first folding area FA1 may be folded in an in-folding manner such that the display surface of the first non-folding area NFA1 and the display surface of the second non-folding area NFA2 are adjacent to each other and face each other. The second folding area FA2 may be folded in an out-folding manner such that the rear surface of the second non-folding area NFA2 and the rear surface of the third non-folding area NFA3 are adjacent to each other and face each other. The display surface FS of the third non-folding area NFA3 may be exposed to the outside in the folded state of the display device DD-1 of one embodiment. When the display device DD-1 of one embodiment is folded as in the operation of FIG. 11, the upper surface US of the window WM in the first non-folding area NFA1 and the upper surface US of the window WM in the second non-folding area NFA2 may be adjacent to each other and may face each other, and the upper surface US of the window WM in the third non-folding area NFA3 may be exposed to the outside.

Referring to FIG. 12A, the first folding area FA1 may be folded to have a first radius of curvature RIN. The first radius of curvature RIN may correspond to the maximum distance from the first folding axis FX1 to the upper surface of the window WM in the first folding area FA1. The second folding area FA2 may be folded to have a second radius of curvature ROT. The second radius of curvature ROT may correspond to the maximum distance from the second folding axis FX2 to the upper surface of the window WM in the second folding area FA2. The second radius of curvature ROT of the out-folded second folding area FA2 may be greater than the first radius of curvature RIN of the in-folded first folding area FA1.

In the display device DD-1 of one embodiment illustrated in FIG. 12A, the gap GFP between the upper surfaces facing each other in the in-folded first folding area FA1 may be greater than the gap GNF between the first non-folding area NFA1 and the second non-folding area NFA2 facing each other in the folded state. In the display device DD-1 of one embodiment, the gap GFP between the upper surfaces of the window WM facing each other in the first folding area FA1 may be gradually increased toward the first folding axis FX1 from portions adjacent to the first and second non-folding areas NFA1 and NFA2. The first folding area FA1 may have a water-drop shape when viewed from above a plane defined by the second directional axis DR2 and the third directional axis DR3. The gap GNF between the upper surfaces of the window WM between the first non-folding area NFA1 and the second non-folding area NFA2 facing each other in the folded state may be smaller than twice the first radius of curvature RIN.

The second folding area FA2 may have a U-shape when viewed from above the plane defined by the second directional axis DR2 and the third directional axis DR3 (e.g., sectional view). In one embodiment illustrated in FIG. 11, when the first folding area FA1 is folded, the first radius of curvature RIN may be smaller than the second radius of curvature ROT. However, embodiments are not limited thereto, and the first radius of curvature RIN and the second radius of curvature ROT may be changed to reflect the thickness of the display device.

FIG. 12B is a side view illustrating a folded state of the display device DD-1*a* according to an embodiment. The display device DD-1*a* according to one embodiment illustrated in FIG. 12B differs from the display device DD-1 according to one embodiment illustrated in FIG. 12A in terms of a folded shape of a first folding area. In the display device DD-1*a* of one embodiment, the first folding area FA1-*a* may be folded in an in-folding manner such that a display surface of a first non-folding area NFA1 and a display surface of a second non-folding area NFA2 are adjacent to each other and face each other, and a second folding area FA2 may be folded in an out-folding manner such that a rear surface of the second non-folding area NFA2 and a rear surface of a third non-folding area NFA3 are adjacent to each other and face each other.

Referring to FIG. 12B, the first folding area FA1-*a* may be folded to have a first radius of curvature RIN-a. The first radius of curvature RIN-a may correspond to the maximum distance from a first folding axis FX1 to an upper surface of a window WM in the first folding area FA1-*a*. The second folding area FA2 may be folded to have a second radius of curvature ROT. The second radius of curvature ROT may correspond to the maximum distance from a second folding axis FX2 to the upper surface of the window WM in the second folding area FA2. The second radius of curvature ROT of the out-folded second folding area FA2 may be greater than the first radius of curvature RIN-a of the in-folded first folding area FA1-*a*. In addition, the first radius of curvature RIN-a of the first folding area FA1-*a* in one embodiment illustrated in FIG. 12B may be smaller than the first radius of curvature RIN of the first folding area FA1 in one embodiment illustrated in FIG. 12A.

In the display device DD-1*a* of one embodiment illustrated in FIG. 12B, the gap GFP-a between the upper surfaces facing each other in the in-folded first folding area FA1-*a* may be equal to the gap GNF-a between the first non-folding area NFA1 and the second non-folding area NFA2 facing each other in the folded state. The first folding area FA1-*a* may have a U-shape when viewed from above the plane defined by the second directional axis DR2 and the third directional axis DR3. The gap GNF-a between the upper surfaces of the window WM between the first non-folding area NFA1 and the second non-folding area NFA2 facing each other in the folded state may correspond to twice the first radius of curvature RIN-a. In one embodiment illustrated in FIG. 12B, when the first folding area FA1-*a* is folded, the first radius of curvature RIN-a may be smaller than the second radius of curvature ROT. However, embodiments are not limited thereto, and the first radius of curvature RIN-a and the second radius of curvature ROT may be changed to reflect the thickness of the display device.

Figure 13A:
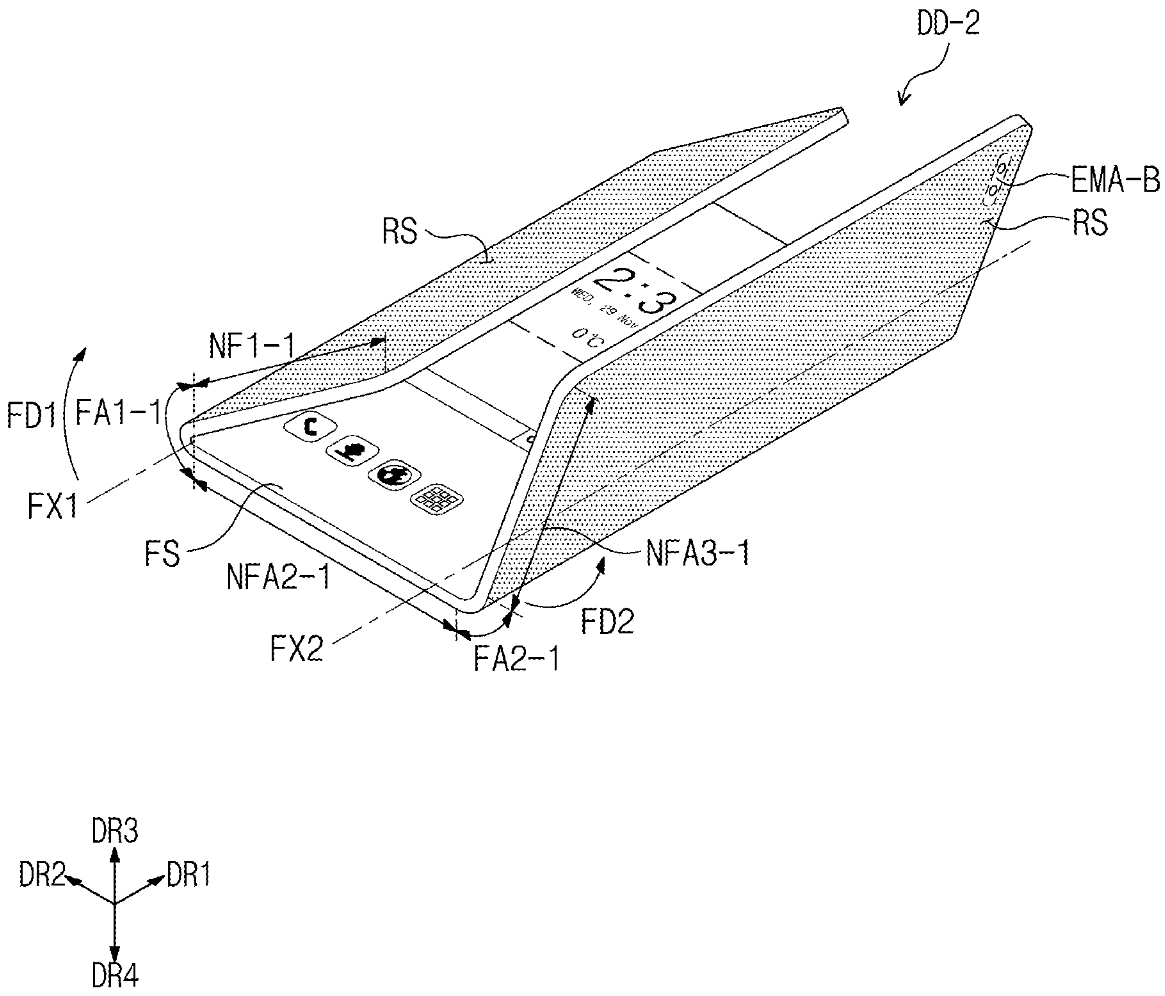
FIG. 13A is a perspective view illustrating a folding process of a display device according to an embodiment of the present disclosure.
Figure 13B:
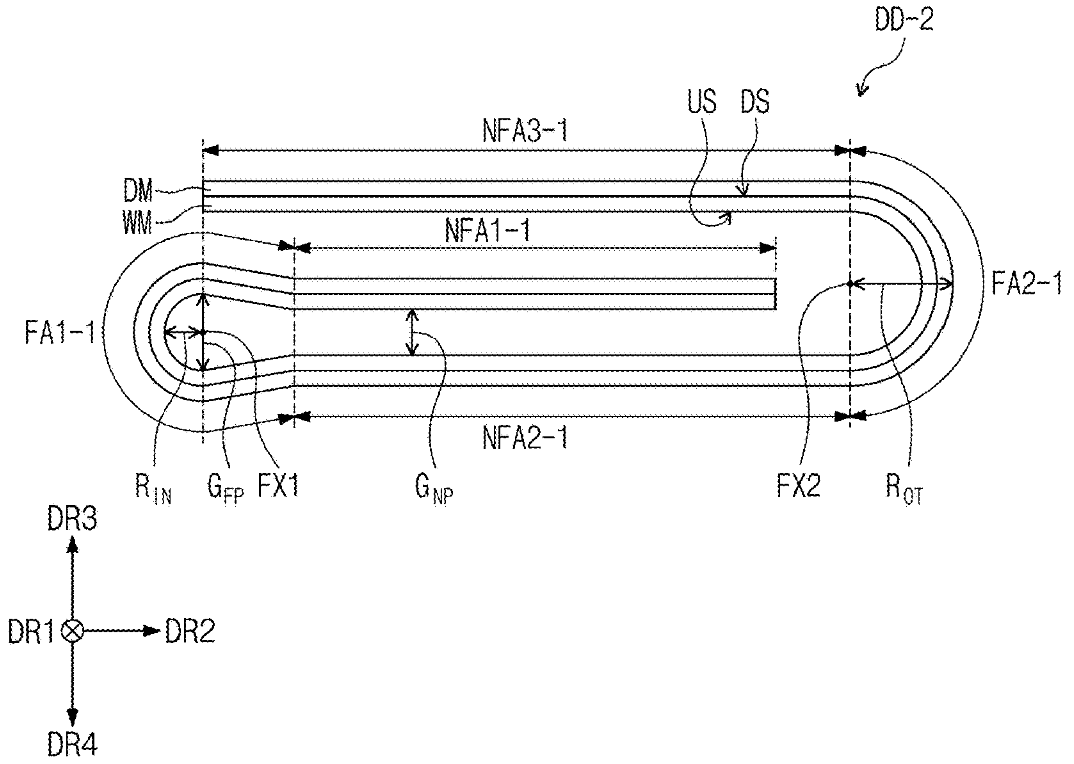
FIGS. 13B and 13C are sectional views illustrating a folded state of the display device according to an embodiment of the present disclosure.
Figure 13C:
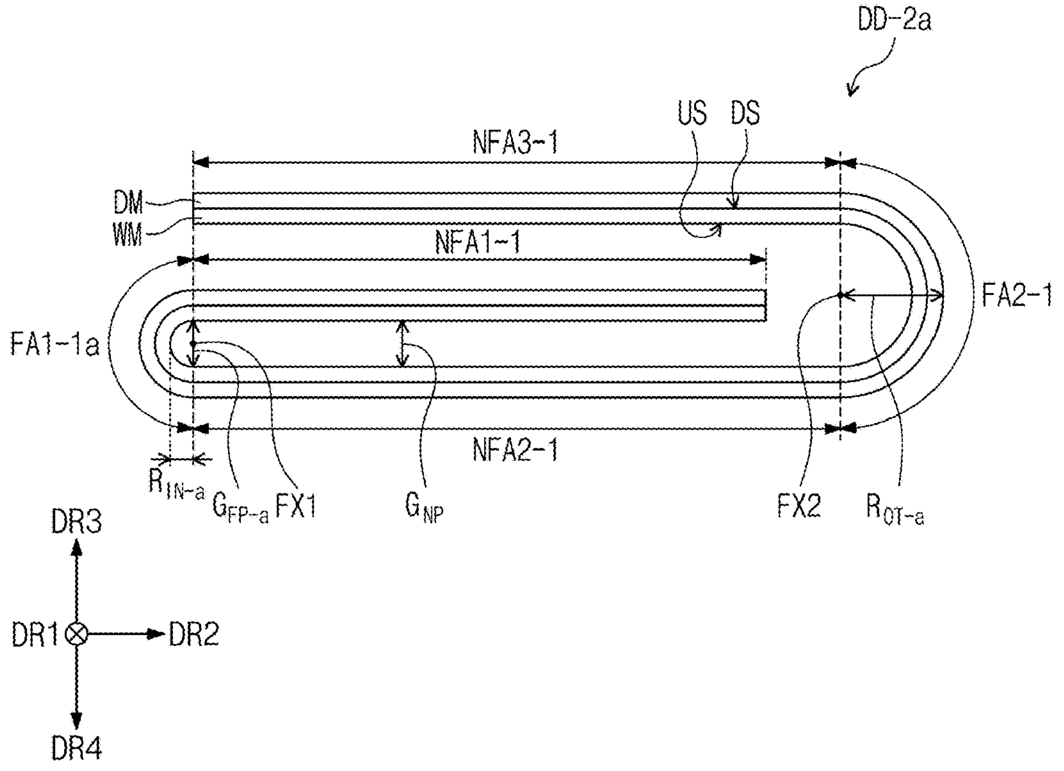

FIG. 13A is a perspective view illustrating a folding process of a display device DD-2 according to an embodiment of the present disclosure. FIG. 13B is a sectional view illustrating a folded state of the display device DD-2 according to an embodiment of the present disclosure. FIG. 13C is a sectional view illustrating a folded state of a display device DD-2*a* according to an embodiment of the present disclosure.

The display device DD-2 of one embodiment illustrated in FIG. 13A may perform a folding operation in a form different from that of the display device DD of one embodiment illustrated in FIG. 2A.

Referring to FIGS. 13A and 13B, the display device DD-2 of one embodiment may include a first folding area FA1-1 folded about a first folding axis FX1 parallel to the first directional axis DR1 and a second folding area FA2-1 folded about a second folding axis FX2 that is parallel to the first directional axis DR1 and is spaced apart from the first folding axis FX1. In one embodiment illustrated in FIGS. 13A and 13B, the first folding axis FX1 and the second folding axis FX2 may be virtual axes extending in the direction of the first directional axis DR1 and may be located over a display surface FS. The second folding axis FX2 may be spaced apart from the first folding axis FX1 in the direction of the second directional axis DR2. However, embodiments are not limited thereto, and the first folding axis FX1 and the second folding axis FX2 may be parallel to each other in any direction rather than the direction of the first directional axis DR1.

In the display device DD-2 of one embodiment, the first folding area FA1-1 may be folded in a first folding direction FD1, and the second folding area FA2-1 may be folded in a second folding direction FD2. In an embodiment, the first folding direction FD1 may be a direction in which the first folding area FA1-1 is folded such that a display surface of a first non-folding area NFA1-1 and a display surface of a second non-folding area NFA2-1 are adjacent to each other and face each other, and the second folding direction FD2 may be a direction in which the second folding area FA2-1 is folded such that a rear surface RS of a third non-folding area NFA3-1 is exposed to the outside.

The display device DD-2 of one embodiment may include a display module DM and a window WM. The window WM may be disposed on the display module DM. The window WM may include a lower surface DS adjacent to the display module DM and an upper surface US facing the lower surface DS in the thickness direction.

In the display device DD-2 of one embodiment, the first folding area FA1-1 may be folded in an in-folding manner such that the display surface of the first non-folding area NFA1-1 and the display surface of the second non-folding area NFA2-1 are adjacent to each other and face each other. The second folding area FA2-1 may be folded in an in-folding manner such that the rear surface of the first non-folding area NFA1-1 and the rear surface of the third non-folding area NFA3-1 are adjacent to each other and face each other. The rear surface RS of the third non-folding area NFA3-1 may be exposed to the outside in the folded state of the display device DD-2 of one embodiment. When the display device DD-2 of one embodiment is folded as in the operation of FIG. 13A, the upper surface US of the window WM in the first non-folding area NFA1-1 and the upper surface US of the window WM in the second non-folding area NFA2-1 may be adjacent to each other and may face each other, and the upper surface US of the window WM in the third non-folding area NFA3-1 may face inward and may be adjacent to the lower surface DS of the window WM in the first non-folding area NFA1-1.

Referring to FIG. 13B, the first folding area FA1-1 may be folded to have a first radius of curvature RIN. The first radius of curvature RIN may correspond to the maximum distance from the first folding axis FX1 to the upper surface of the window WM in the first folding area FA1-1. The second folding area FA2 may be folded to have a second radius of curvature ROT. The second radius of curvature ROT may correspond to the maximum distance from the second folding axis FX2 to the upper surface of the window WM in the second folding area FA2-1. The second radius of curvature ROT of the second folding area FA2-1 folded in an in-folding manner at a relatively outer position may be greater than the first radius of curvature RIN of the first folding area FA1-1 folded in an in-folding manner at a relatively inner position.

In one embodiment illustrated in FIG. 13B, when the first folding area FA1-1 is folded, the first radius of curvature RIN may be smaller than the second radius of curvature ROT. However, embodiments are not limited thereto, and the first radius of curvature RIN and the second radius of curvature ROT may be changed to reflect the thickness of the display device.

Referring to FIG. 13B, in the display device DD-2 of one embodiment, the gap GFP between the upper surfaces facing each other in the in-folded first folding area FA1-1 may be greater than the gap GNP between the first non-folding area NFA1-1 and the second non-folding area NFA2-1 facing each other in the folded state. The gap GNP between the upper surfaces of the window WM between the first non-folding area NFA1-1 and the second non-folding area NFA2-1 facing each other in the folded state may be smaller than twice the first radius of curvature RIN.

The first folding area FA1-1 may have a water-drop shape when viewed from above the plane defined by the second directional axis DR2 and the third directional axis DR3. The second folding area FA2-1 may have a U-shape when viewed from above the plane defined by the second directional axis DR2 and the third directional axis DR3.

FIG. 13C is a side view illustrating a folded state of the display device DD-2*a* according to an embodiment. The display device DD-2*a* according to one embodiment illustrated in FIG. 13C differs from the display device DD-2 according to one embodiment illustrated in FIG. 13B in terms of a folded shape of a first folding area. In the display device DD-2*a* of one embodiment, the first folding area FA1-1*a* may be folded in an in-folding manner such that a display surface of a first non-folding area NFA1-1 and a display surface of a second non-folding area NFA2-1 are adjacent to each other and face each other. A second folding area FA2-1 may be folded in an in-folding manner such that a rear surface of the first non-folding area NFA1-1 and a display surface of a third non-folding area NFA3-1 are adjacent to each other and face each other.

In the display device DD-2*a* of one embodiment, the gap GFP-a between upper surfaces facing each other in the in-folded first folding area FA1-1*a* may be equal to the gap GNP between the first non-folding area NFA1-1 and the second non-folding area NFA2-1 in the folded state. The first folding area FA1-1*a* may have a U-shape when viewed from above the plane defined by the second directional axis DR2 and the third directional axis DR3. The gap GNP between upper surfaces of a window WM between the first non-folding area NFA1-1 and the second non-folding area NFA2-1 facing each other in the folded state may correspond to twice a first radius of curvature RIN-a.

In one embodiment illustrated in FIG. 13C, when the first folding area FA1-1*a* is folded, a second radius of curvature ROT-a may be greater than the first radius of curvature RIN-a. However, embodiments are not limited thereto, and the first radius of curvature RIN-a and the second radius of curvature ROT-a may be changed to reflect the thickness of the display device.

Figure 14:
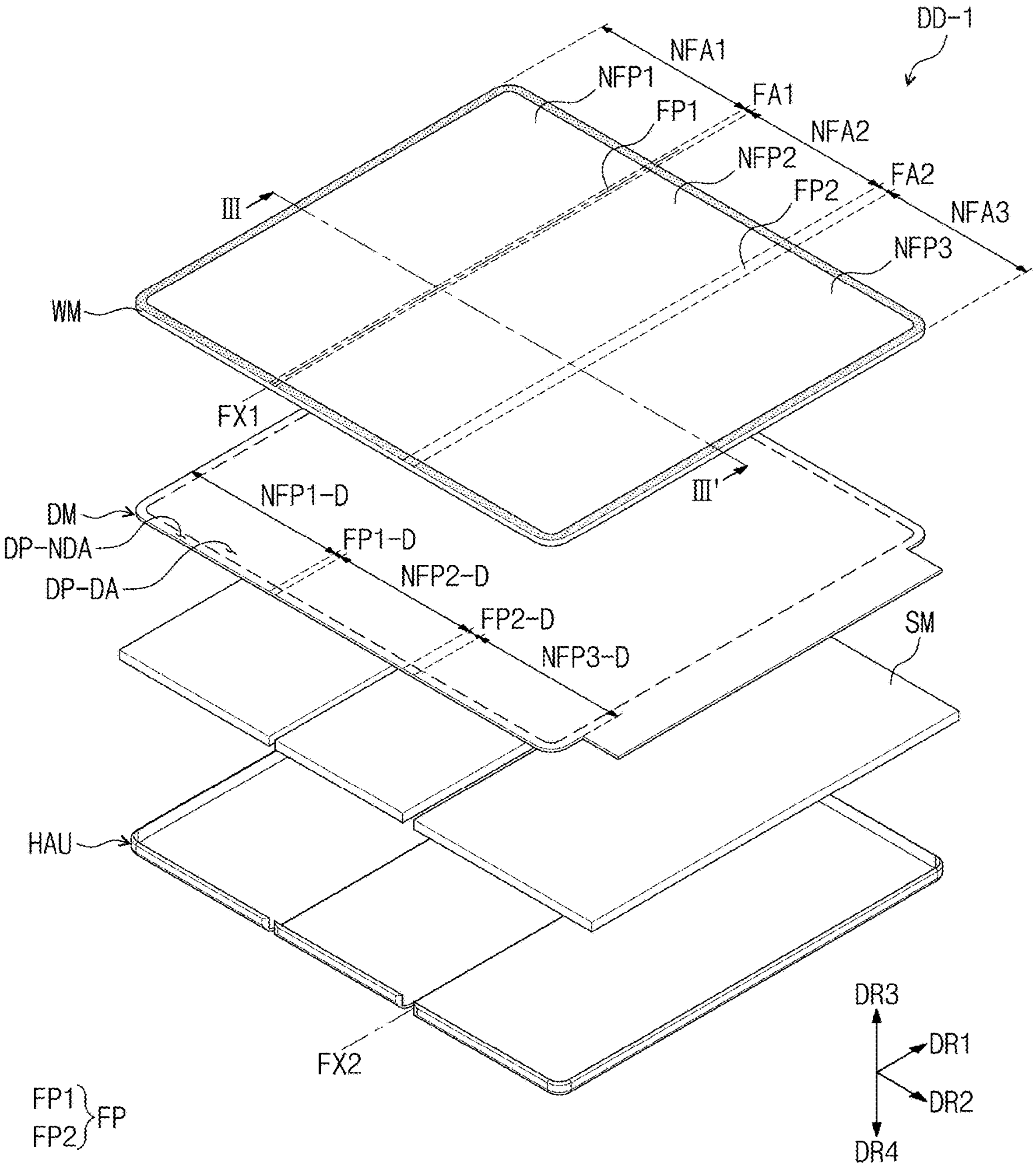
FIG. 14 is an exploded perspective view of a display device according to an embodiment of the present disclosure.
Figure 15:
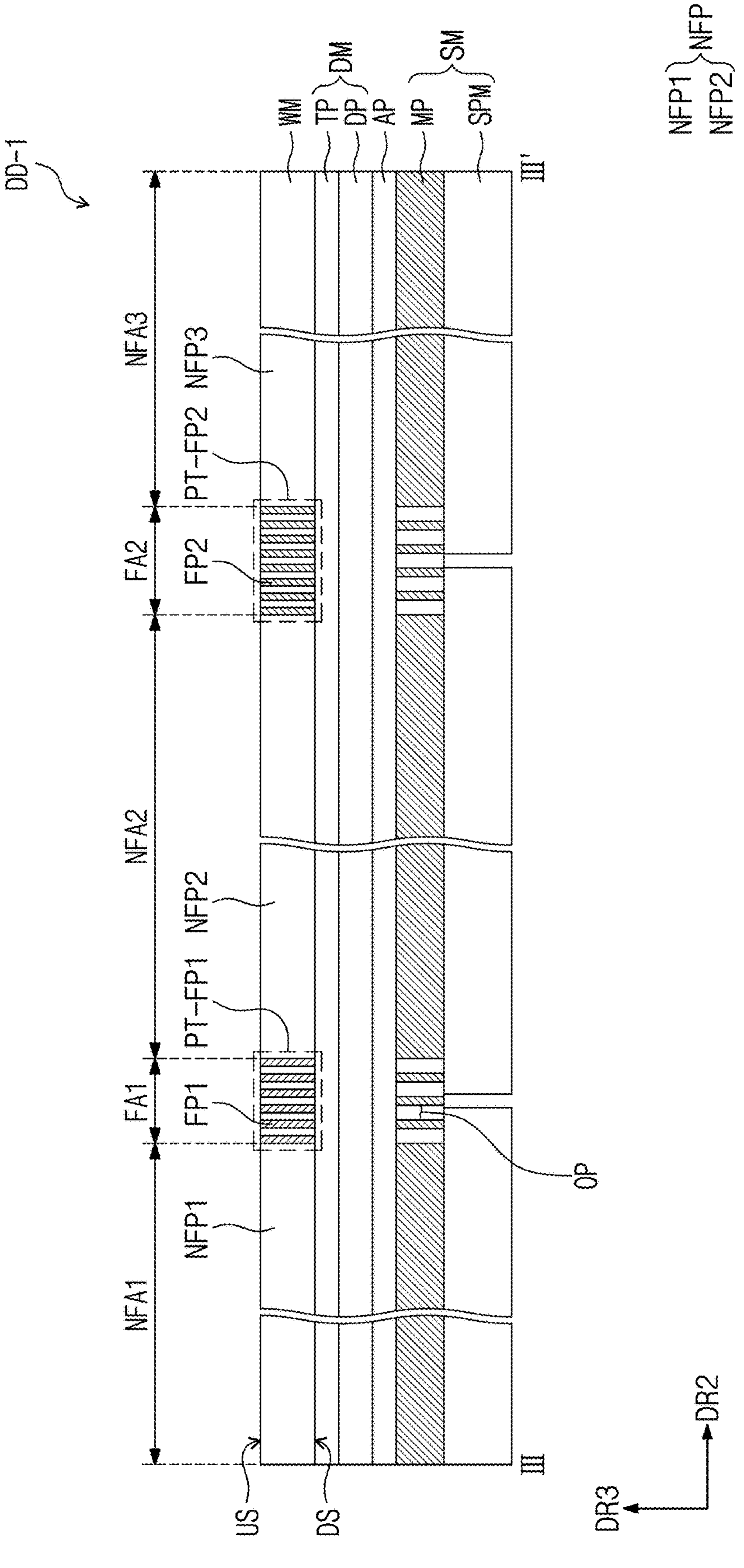
FIG. 15 is a sectional view of the display device according to an embodiment of the present disclosure.

FIG. 14 is an exploded perspective view of the display device DD-1 according to an embodiment of the present disclosure. FIG. 15 is a sectional view of the display device DD-1 according to an embodiment of the present disclosure. Components identical/similar to the components described above with reference to FIGS. 1A to 13 will be assigned with identical/similar reference numerals, and detailed descriptions thereabout will be omitted.

Referring to FIGS. 14 and 15, the window WM may include a first non-folding part NFP1, a first folding part FP1, a second non-folding part NFP2, a second folding part FP2, and a third non-folding part NFP3 arranged in the direction of the second directional axis DR2. The radius of curvature when the first folding part FP1 is folded may be smaller than the radius of curvature when the second folding part FP2 is folded. In addition, the width of the first folding part FP1 in the direction of the second directional axis DR2 may be smaller than the width of the second folding part FP2 in the direction of the second directional axis DR2. The first folding part FP1 and the second folding part FP2 may have a width of "pR" or more in the direction of the second directional axis DR2. Here, "R" corresponds to the radius of curvature of each of the first and second folding parts. The window WM according to an embodiment will be described below in more detail. The width of the first folding part FP1 may be greater than or equal to "pX (a first radius of curvature)", and the width of the second folding part FP2 may be greater than or equal to "pX (a second radius of curvature)". The first radius of curvature and the second radius of curvature may be the radius of curvature of the first folding part FP1 and the radius of curvature of the second folding part FP2, respectively.

The display module DM may include folding display parts FP1-D and FP2-D and non-folding display parts NFP1-D, NFP2-D, and NFP3-D. The folding display parts FP1-D and FP2-D may be parts corresponding to the folding areas FA1 and FA2 (refer to FIGS. 1A and 2A), and the non-folding display parts NFP1-D, NFP2-D, and NFP3-D may be parts corresponding to the non-folding areas NFA1, NFA2, and NFA3 (refer to FIG. 1A). That is, a plurality of folding areas and a plurality of folding parts may be provided, and the number of folding areas and the number of folding parts may be equal to each other.

The first folding display part FP1-D may correspond to a part folded or bent about the first folding axis FX1 extending in the direction of the first directional axis DR1. The second folding display part FP2-D may correspond to a part folded or bent about the second folding axis FX2 extending in the direction of the first directional axis DR1. The display module DM may include the first non-folding display part NFP1-D and the second non-folding display part NFP2-D spaced apart from each other with the first folding display part FP1-D therebetween, and the second non-folding display part NFP2-D and the third non-folding display part NFP3-D spaced apart from each other with the second folding display part FP2-D therebetween.

Figure 16A:
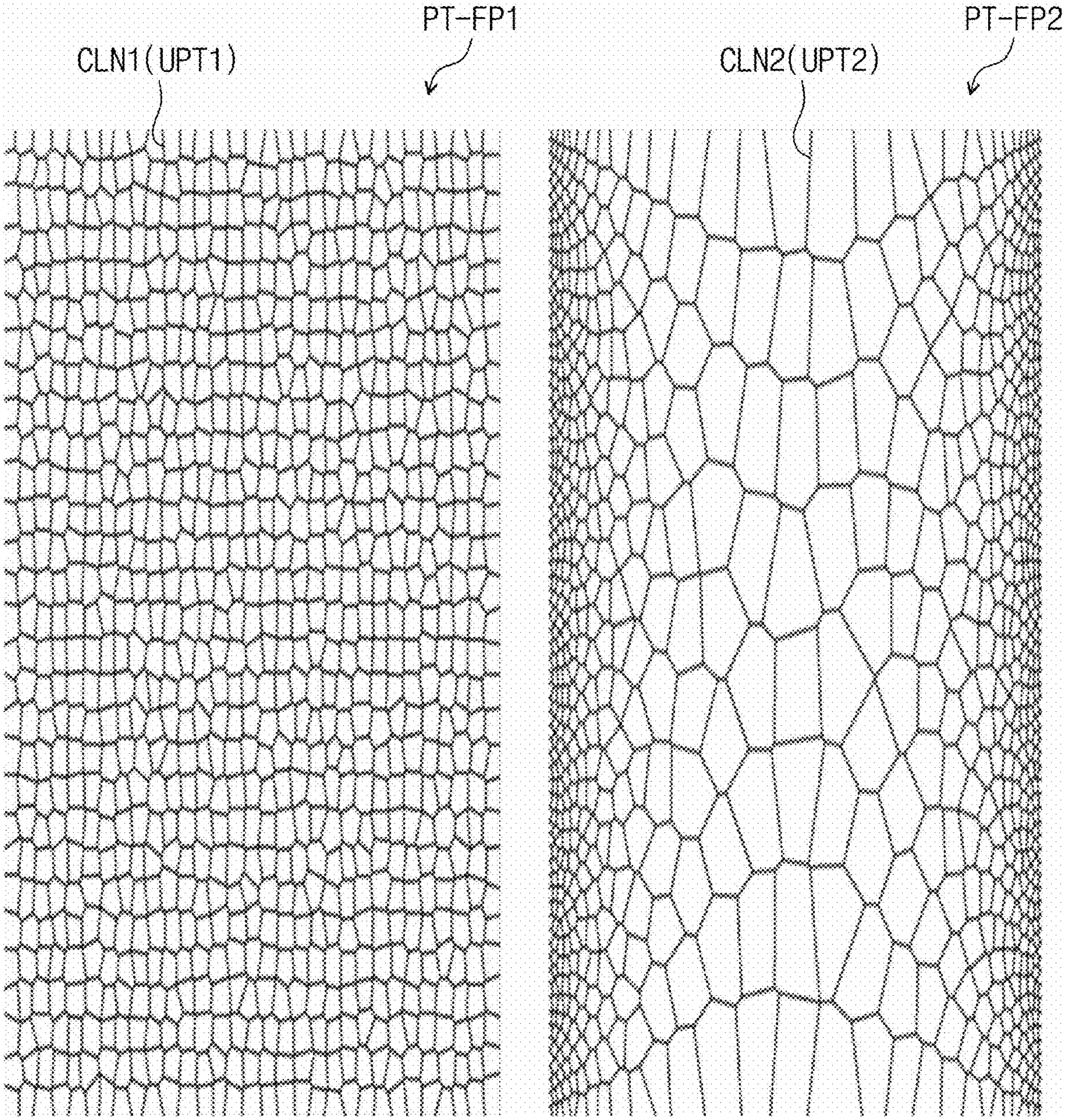
FIGS. 16A and 16B are enlarged plan views of a glass cover according to an embodiment of the present disclosure.
Figure 16B:
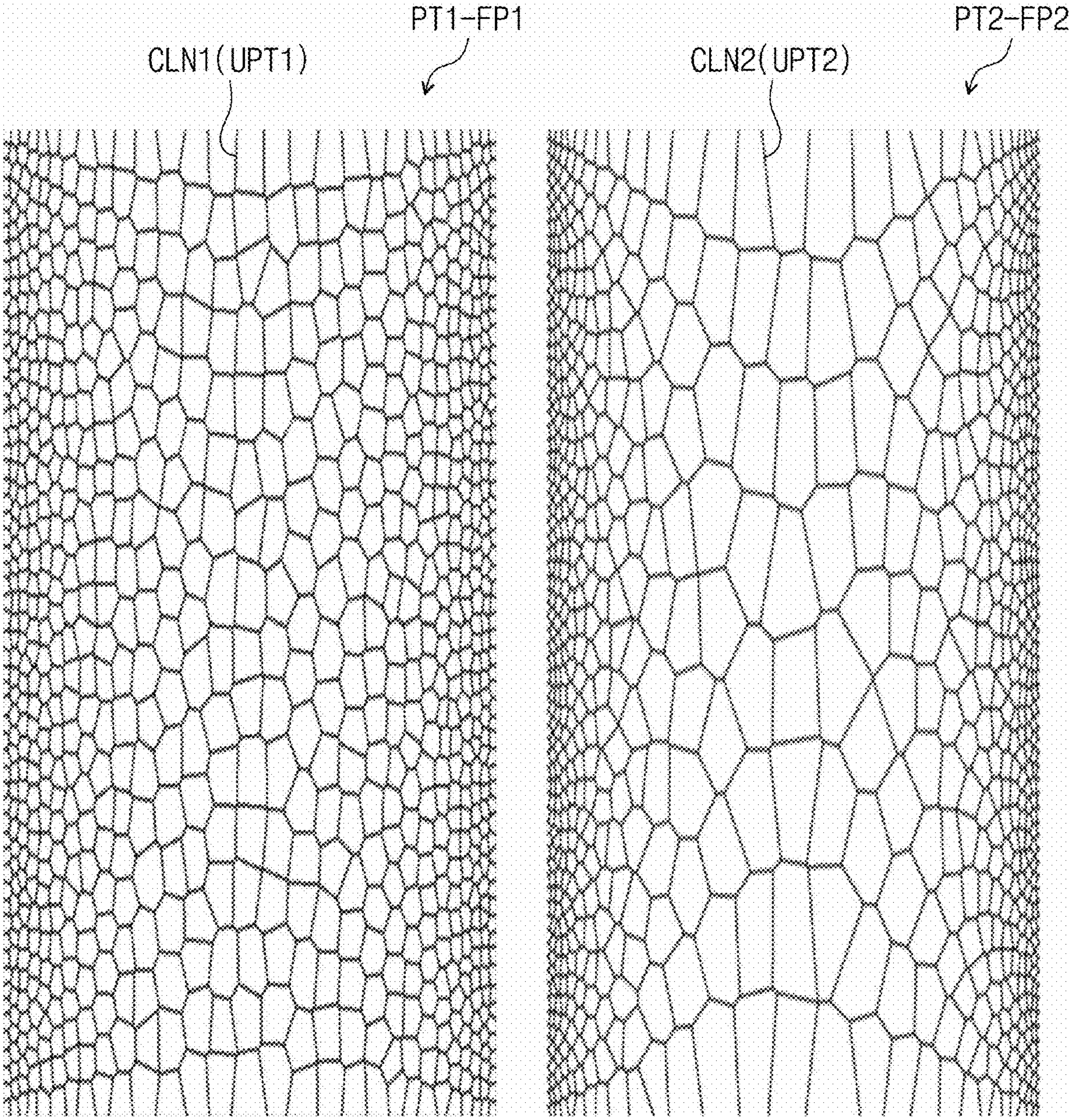

FIGS. 16A and 16B are enlarged plan views of a glass cover according to an embodiment of the present disclosure.

Referring to FIG. 16A, a first irregular pattern UPT1 may be defined in the first folding part FP1 (refer to FIG. 14) that overlaps the first folding axis FX1 (refer to FIG. 14), and a second irregular pattern UPT2 may be defined in the second folding part FP2 (refer to FIG. 14) that overlaps the second folding axis FX2 (refer to FIG. 14). In this case, the radius of curvature of the first folding part FP1 (refer to FIG. 14) may be smaller than the radius of curvature of the second folding part FP2 (refer to FIG. 14).

According to an embodiment of the present disclosure, the sizes of closed lines CLN1 of the first irregular pattern UPT1 may be different from the sizes of closed lines CLN2 of the second irregular pattern UPT2. In addition, in the second irregular pattern UTP2, the closed lines CLN2 may have different sizes depending on positions.

According to an embodiment of the present disclosure, the density of the closed lines CLN1 of the first irregular pattern UPT1 may be the same even though the closed lines CLN1 are spaced apart from the first folding axis FX1 (refer to FIG. 14). The density of the closed lines CLN2 of the second irregular pattern UPT2 may be increased as the closed lines CLN2 are spaced apart from the second folding axis FX2 (refer to FIG. 14).

By placing, in the second folding part FP2 (refer to FIG. 14) having a large radius of curvature, the second irregular pattern UPT2, the central portion of which has small bending characteristics, the glass cover GL (refer to FIG. 5A) may be prevented from being excessively folded and unfolded during folding and unfolding, and thus damage to the glass cover GL (refer to FIG. 5A) may be prevented.

Without being limited to that illustrated, the closed lines CLN2 of the second irregular pattern UPT2 may be the same irregular pattern as the closed lines CLN1 of the first irregular pattern UPT1 and are not limited to any one embodiment.

Referring to FIG. 16B, the density of the closed lines CLN1 of the first irregular pattern UPT1 may be increased as the closed lines CLN1 are spaced apart from the first folding axis FX1 (refer to FIG. 14), and the density of the closed lines CLN2 of the second irregular pattern UPT2 may be increased as the closed lines CLN2 are spaced apart from the second folding axis FX2 (refer to FIG. 14). In this case, the minimum value of the density of the closed lines CLN1 of the first irregular pattern UPT1 may be smaller than the minimum value of the density of the closed lines CLN2 of the second irregular pattern UPT2.

Without being limited to that illustrated, the second irregular pattern UPT2 may be the same irregular pattern as the first irregular pattern UPT1 and is not limited to any one embodiment.

As described above, the display device may have good folding characteristics and may prevent deterioration in display quality.

Furthermore, the display device may include the glass cover having the grooves formed in the irregular pattern and thus may prevent Moire interference from occurring in relation to the pixels having the regular pattern.

Moreover, by modifying the aspect ratio of the irregular pattern forming the grooves to 1:n, the display device may have good folding characteristics.

In addition, the display device may have good folding characteristics using the Voronoi pattern obtained by modifying the aspect ratio of the irregular pattern forming the grooves to 1:n.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:

a display panel including a plurality of pixels, a folding area foldable about a folding axis defined in a direction parallel to a first direction, and a first non-folding area and a second non-folding area spaced apart from each other in a second direction crossing the first direction with the folding area therebetween; and a glass cover disposed on the display panel, the glass cover including a first non-folding part, a folding part, and a second non-folding part arranged in the second direction and disposed to overlap the first non-folding area, the folding area, and the second non-folding area, respectively, wherein the folding part defines grooves corresponding to closed lines, respectively, wherein pixels disposed to overlap the folding area among the plurality of pixels form a regular pattern, and the closed lines form an irregular pattern, and wherein a first reference ratio defined as a total number of grooves per unit length disposed to overlap a line extending in the first direction and pass through a center point of the folding part is smaller than a second reference ratio defined as a total number of grooves per unit length disposed to overlap a line extending in the second direction and pass through the center point of the folding part.

2. The display device of claim 1, wherein the irregular pattern corresponds to a pattern obtained by modifying an aspect ratio of a Voronoi pattern to 1:n, wherein the aspect ratio is a ratio of a length in the second direction to a length in the first direction of the Voronoi pattern, and wherein the n is greater than 1.

3. The display device of claim 2, wherein the n is less than or equal to 5.

4. The display device of claim 1, wherein the folding part includes a first portion adjacent to the folding axis and a second portion farther away from the folding axis than the first portion, and wherein a density of the closed lines in the first portion is lower than a density of the closed lines in the second portion.

5. The display device of claim 1, wherein the folding area is provided in plurality, and the plurality of folding areas are foldable about different folding axes, respectively, and wherein the folding part is provided in plurality, and a total number of the folding areas is equal to a total number of the folding parts.

6. The display device of claim 1, wherein a ratio of the second reference ratio to the first reference ratio is greater than 1 and less than or equal to 5.

7. The display device of claim 1, wherein the glass cover further includes a filling portion accommodated in the grooves, and wherein the filling portion includes at least one of an acrylate-based resin, a silicone-based resin, a urethane-based resin, or an epoxy-based resin.

8. The display device of claim 7, wherein the filling portion has a thickness greater than a depth of each of the grooves.

9. The display device of claim 1, wherein the glass cover has a thickness of 50 micrometers (μm) to 150 μm, and wherein the folding part has a width of 6.6 millimeters (mm) or less in the second direction.

10. The display device of claim 1, wherein the plurality of grooves each have a width of 50 μm to 100 μm, and wherein the plurality of grooves each have a depth of 50 μm to 100 μm.

11. The display device of claim 1, wherein upper and lower sides of each of the grooves have different widths from each other.

12. The display device of claim 1, wherein the grooves are connected together to have a one-body shape, and wherein the irregular pattern has a net shape.

13. The display device of claim 1, wherein the glass cover includes:

a lower surface disposed to face the display panel; and an upper surface disposed to face away from the upper surface, and wherein the plurality of grooves are defined on the upper surface of the glass cover or the lower surface of the glass cover.

14. The display device of claim 13, wherein the plurality of grooves include:

a plurality of first grooves defined on the upper surface of the glass cover; and a plurality of second grooves defined on the lower surface of the glass cover, and wherein the first grooves and the second grooves do not overlap each other in a plan view.

15. A display device comprising:

a display panel including a plurality of pixels, a folding area foldable about a folding axis defined in a direction parallel to a first direction, and a first non-folding area and a second non-folding area spaced apart from each other in a second direction crossing the first direction with the folding area therebetween; and a glass cover disposed on the display panel, the glass cover including a first non-folding part, a folding part, and a second non-folding part arranged in the second direction and disposed to overlap the first non-folding area, the folding area, and the second non-folding area, respectively, wherein the folding part defines grooves corresponding to closed lines, respectively, wherein each of the closed lines corresponds to a pattern obtained by modifying an aspect ratio of a Voronoi pattern to 1:n, wherein the aspect ratio is a ratio of a length in the second direction to a length in the first direction of the Voronoi pattern, and wherein the n is greater than 1.

16. The display device of claim 15, wherein a first reference ratio defined as a total number of grooves per unit length disposed to overlap a line extending in the first direction with respect to a center point of the folding part is smaller than a second reference ratio defined as a total number of grooves per unit length configured to overlap a line extending in the second direction with respect to the center point of the folding part.

17. The display device of claim 15, wherein the n is less than or equal to 5.

18. The display device of claim 15, wherein the folding part includes a first portion adjacent to the folding axis and a second portion farther away from the folding axis than the first portion, and wherein a density of the closed lines in the first portion is lower than a density of the closed lines in the second portion.

19. The display device of claim 15, wherein the glass cover further includes a filling portion accommodated in the grooves.

20. The display device of claim 15, wherein the grooves are connected together to have a one-body shape, and wherein the closed lines form an irregular pattern, and the irregular pattern has a net shape.

* * * * *